(12) United States Patent
Li et al.

(10) Patent No.: US 9,983,808 B2
(45) Date of Patent: May 29, 2018

(54) NAND FLASH RELIABILITY WITH RANK MODULATION

(71) Applicants: California Institute of Technology, Pasadena, CA (US); Texas A&M University System, College Station, CA (US)

(72) Inventors: Yue Li, College Station, TX (US); Eyal En Gad, Pasadena, CA (US); Anxiao Jiang, College Station, TX (US); Jehoshua Bruck, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days. days.

(21) Appl. No.: 14/965,869

(22) Filed: Dec. 10, 2015

(65) Prior Publication Data

US 2016/0170672 A1      Jun. 16, 2016

Related U.S. Application Data

(60) Provisional application No. 62/090,255, filed on Dec. 10, 2014.

(51) Int. Cl.
| G06F 12/00 | (2006.01) |
| G06F 3/06 | (2006.01) |
| G11C 11/56 | (2006.01) |
| G11C 16/08 | (2006.01) |
| G11C 16/26 | (2006.01) |
| G11C 7/10 | (2006.01) |
| G11C 8/12 | (2006.01) |
| G11C 16/34 | (2006.01) |

(52) U.S. Cl.
CPC .......... *G06F 3/0619* (2013.01); *G06F 3/0638* (2013.01); *G06F 3/0679* (2013.01); *G11C 11/5642* (2013.01); *G11C 16/08* (2013.01); *G11C 16/26* (2013.01); *G11C 7/1006* (2013.01); *G11C 8/12* (2013.01); *G11C 16/349* (2013.01)

(58) Field of Classification Search
None
See application file for complete search history.

(56) References Cited

U.S. PATENT DOCUMENTS

2009/0132758 A1* 5/2009 Jiang .................. G06F 11/1072
                                                                   711/103
2009/0132895 A1* 5/2009 Jiang .................. G06F 11/1072
                                                                   714/781

* cited by examiner

*Primary Examiner* — Baboucarr Faal
(74) *Attorney, Agent, or Firm* — Kilpatrick Townsend & Stockton LLP

(57) ABSTRACT

The reliability of NAND flash memory decreases rapidly as density increases, preventing the wide adoptions of flash-based storage systems. A novel data representation scheme named rank modulation (RM) is discussed for improving NAND flash reliability. RM encodes data using the relative orders of memory cell voltages, which is inherently resilient to asymmetric errors. For studying the effectiveness of RM in flash, RM is adapted to make it simple to implement with existing flash memories. The implementation is evaluated under different types of noise of 20 nm flash memory. Results show that RM offers significantly lower cell error rates compared to the current data representation in flash at typical P/E cycles. RM is applied to flash-based archival storage and shows that RM brings up to six times longer data retention time for 16 nm flash memory.

25 Claims, 14 Drawing Sheets

NAND FLASH RELIABILITY WITH RANK MODULATION

CROSS-REFERENCES TO RELATED APPLICATIONS

This application is a Non-provisional application which claims the benefit of U.S. Provisional Application No. 62/090,255, filed Dec. 10, 2014 and entitled "IMPROVING NAND FLASH RELIABILITY WITH RANK MODULATION" which is incorporated herein in its entirety for all purposes.

BACKGROUND

This disclosure relates to data storage with NAND flash devices and, more particularly, utilizing Rank Modulation in a physical implementation of NAND flash devices that achieves improved reliability.

BRIEF SUMMARY

In one embodiment, the techniques described herein provide a computer method of operating a data device in which the data device receives a binary representation from a host interface, the binary representation comprising a data value to be encoded into a rank modulation codeword, wherein the rank modulation codeword represents a state P of N cells, such that each cell N stores a charge and has a state represented by up to r charge levels. The data device then maps each binary representation of the data value to a state P of one of the N cells in sequence of the data value bits. The data device then provides the values of the N cells to a data destination over an information channel.

In another embodiment, the techniques described herein provide a computer method of operating a data device in which the data device receives a binary representation of data comprising $a_i$ values that define a rank modulation codeword given by A, where $A=[a_1, a_2, \ldots, a_n]$ integer values. The data device then determines a data value that corresponds to the rank modulation codeword. The data device then provides the values of the N cells to a data destination over an information channel.

Other features and advantages of the present invention should be apparent from the following description of exemplary embodiments, which illustrate, by way of example, aspects of the invention.

DETAILED DESCRIPTION

I. Introduction

NAND flash memory is leading a new series of revolutions in data storage. From small mobile devices to large data centers, flash has been improving computing in many ways with its excellent properties such as random access and low power consumption. The density of flash memory keeps increasing following Moore's law. The technology node has shrunk below 20 nm with each cell storing more than one bit.

However, the density of flash grows at the price of significantly reduced reliability. Data in flash are represented by the amount of charge held by floating-gates (FGs). In smaller process nodes, a FG can trap much less charge. Therefore data become more vulnerable to noise and process variation, which results in shortened device life time. For instance, a 34 nm single-level cell storing one bit has $10^5$ program-erase (P/E) cycle endurance, while a 16 nm multi-level cell (MLC) storing two bits can only survive 3000 P/E cycles.

A natural solution to the reliability issue is error-correcting code (ECC). The correction capability of an ECC depends on the redundancy and the code length used for protecting information. In general, the scaling of ECC's correction capability is much slower than the bit error rates in flash of higher density. Efficient error correction with negligible redundancy and short code length design will become unfeasible. To enable the continued scaling of flash memory more fundamental changes are needed. We propose one such change in this work.

Figure 1:
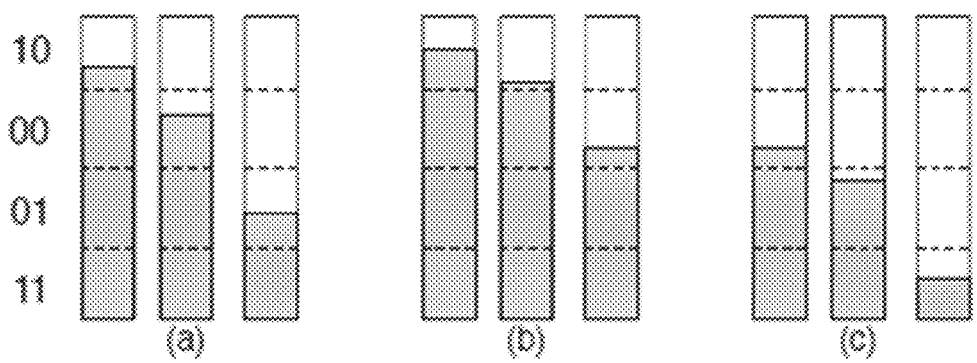
FIG. 1 is an illustration that depicts charge levels of a memory device in an example Rank Modulation system.

This paper tackles the reliability issue from the angle of data representations. Our goal is to show that flash is much more reliable by adopting a novel data representation tailored for resisting typical errors in flash, namely, rank modulation (RM). RM is first proposed by Jiang et al. [see A. Jiang et al., *IEEE Trans. on Inform. Theory*, vol. 55, no. 6, pp. 2659-2673, June 2009.], which completes the communication model of flash with a modulator. (A modulator converts data into a format that is more suitable for the channel.) Consider the example in FIG. 1 with three MLCs. Program interference or charge leakage tends to shift cell levels towards the same direction. Current flash memory reads the bits stored in a cell by comparing the cell voltage with predetermined reference voltages (marked by dashed lines). Therefore, bit errors are introduced under disturb and charge leakage in the example. RM uses the relative order of cell voltages to represent data. FIG. 1(a) implies the voltage order such that the leftmost cell is the highest and the rightmost cell is the lowest. As the voltage order stays the same after receiving noise, the data corresponding to the voltage order are still correct. When data are stored using RM, the cells only need to be programmed to satisfy the corresponding voltage order instead of being pushed to predetermined target threshold voltages, which provides potential for achieving higher reliability. Rank modulation scheme has received significant amount of attention from the data storage community since the seminal work, and many works based on RM have been proposed.

However, the practical performance of RM in flash is still unknown due to the lack of implementation studies. The main implementation challenge is to realize direct voltage comparison between two cells for determining the rank of each cell. Although recent work suggests solutions with new circuit architectures [see, e.g., M. Kim et al., *IEEE Int. Midwest Symp. on Circuits and Systems*, August 2012, pp. 294-297; M. Kim et al., *IEEE Int. Midwest Symp. on Circuits and Systems*, August 2013, pp. 1354-1357], fabricating an NAND flash chip with such circuits being integrated is a costly and daunting task without the support from flash chip manufacturers.

This paper takes an alternative approach to implement RM in existing flash chips. By noticing that the cell-to-cell comparison can be achieved via the read-retry feature of recent NAND flash memories, we implement RM with existing flash chips for the first time. The approach allows us to compare the performance between RM and conventional data representations under different types of noise using the latest flash memories. The evaluation results motivate the adoption of RM in flash-based archival storage to achieve significantly extended data retention time.

The contributions of this paper include:

1. Adaptations that make rank modulation implementable using existing NAND flash memories (Section 4). The adaptations are simple and utilize the read-retry feature that has been made publicly available in recent NAND flash memories. The scheme does not require modifying flash chips, nor access to the internal testing commands of flash manufacturers.

2. Application of RM in the scenarios of flash-based archival storage using 16 nm MLC and 19 nm TLC (Section 5). The flash packages are baked to emulate long term enterprise class data retention. For RM and conventional data representation, we estimate the maximum data retention time assuming a periodic and an adaptive flash memory scrubbing algorithms proposed for SSDs. Evaluations show that RM provides significantly longer retention time than traditional MLC and TLC can offer.

II. Background Work

In this section, the basic concepts of NAND flash memories that will be referred to later in this paper are reviewed. Related work is then discussed, including rank modulation, flash characterization, and related schemes for improving NAND flash reliability.

A. NAND Flash Basics

1. Organization

NAND flash organizes billions of cells hierarchically. For instance, a flash chip may contain two planes. A plane has 1000 blocks. A block contains 256 pages with page size 2 KB. Each bit is mapped to a cell made of FG. A cell is the basic storage unit of flash. Due to the limited availability of TLC on the electrical component market, all the experiments in this paper used MLC. In the next, the concepts of MLC are introduced, and the concepts of TLC are similar.

Data stored by a cell are represented using charge level. The amount of charge in a cell is quantized into q levels to store $\log_2 q$ bits, e.g., for MLC q=4. We refer the two bits in an MLC as the most significant bit (MSB) and the least significant bit (LSB), respectively.

A block consists of many wordlines (WLs) and bitlines (BLs). A WL connects a row of cells. The MSBs (LSBs) of the cells in a wordline form an upper (a lower) page. A BL connects the cells of the same column index in their corresponding WLs. This work assumes an even-odd-bitline (EOBL) architecture for flash due to the chips that are used in our experiments. The EOBL architecture divides the bitlines of a block into even BLs and odd BLs. An even (odd) BL only connects the cells with even (odd) column indices in their WLs of residence.

2. Programming

A wordline contains four pages, namely, even lower, even upper, odd lower, and odd upper pages. In each WL, even (lower) pages are programmed before odd (upper) pages. The pages in a block are programmed following a specific order to reduce program interference. This is called sequential programming. For additional details, reference should be made to datasheets of NAND flash, available from respective vendors.

Figure 2:
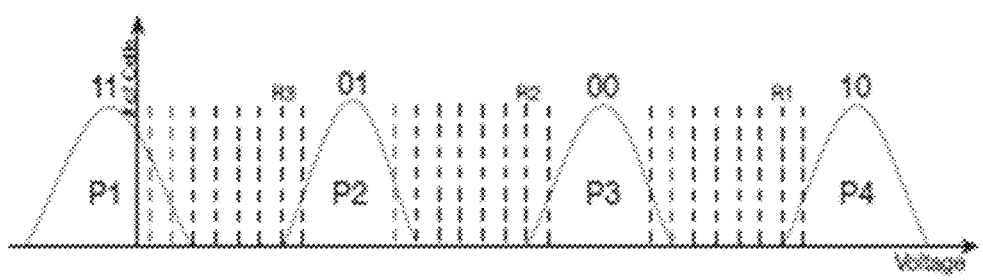
FIG. 2 is an illustration that depicts threshold voltage distributions of a Multi-Level Cell (MLC) memory device.

A cell can be programmed to one of four logical states denoted by P1, P2, P3 and P4. Each state is mapped to two bits using a Gray code. The distribution of cell threshold voltages of each state can be approximated using a Gaussian distribution [see, e.g., Y. Cai, E. F. et al., *Proceedings of the Conference on Design, Automation and Test in Europe*, 2013, pp. 1285-1290]. FIG. 2 shows an example of the distributions. The distributions imply that the cell voltages after programming are close to the means of the distributions with high probability, and there is a small chance that a cell is not programmed to the desired voltage region due to noise and process variation.

3. Reading

To read the state of a cell, the voltage of the cell is compared to predetermined reference voltages. LSBs and MSBs are read separately. LSB is read with a reference voltage placed between P2 and P3, e.g., $R_2$. MSB is read with one reference voltage placed between P1 and P2, e.g., $R_3$, and the other one placed between P3 and P4, e.g., $R_1$.

4. Read-Retry

Noise in flash shifts cell voltages, and the default reference voltages will no longer be optimal as memory ages. To mitigate this issue, recent NAND flash memories include the read-retry (RR) feature which provides user multiple reference voltages for reading. A typical NAND flash using 16 nm and 20 nm technologies supports 8 different reference voltages between two adjacent states. An example is shown in FIG. 2.

The reference voltages provided by RR are typically distributed in the region where the distributions of two adjacent states tend to overlap. Previous work have used more reference voltages in a much wider voltage range for flash characterizations [Y. Cai, E. F. et al., *Proceedings of the Conference on Design, Automation and Test in Europe*, 2013, pp. 1285-1290; N. Papandreou et al., *Proceedings of the 24th Edition of the Great Lakes Symposium on VLSI*, 2014, pp. 151-156], we shall emphasize that these work uses internal testing commands of flash vendors, which is generally not available to normal users.

Assume the default reference voltage(s) is (are) the highest one(s) among the available choices for a LSB (MSB) page. If the current read produces too many errors to correct using ECC, RR is triggered to use the next lower reference voltage to read the page until error correction is successful or all references have been tried. As discussed below, implementations of RM described herein are based on the RR feature.

B. Rank Modulation

The RM scheme was proposed for improving flash memory reliability by Jiang et al. [A. Jiang et al., *IEEE Trans. on Inform. Theory*, vol. 55, no. 6, pp. 2659-2673, June 2009], and was later extended to use multiset permutations by En Gad et al. [see E. En Gad et al., *Proc. IEEE Int. Symp. Inf. Theory (ISIT)*, July 2013, pp. 704-708]. This extended RM scheme is used in this paper for implementation study. A similar scheme of multiset permutations for flash memories was proposed by Sala et al. [see Sala et al., *IEEE Transactions on Communications*, vol. 61, no. 7, pp. 2624-2634, July 2013], including a construction of suitable error-correcting codes (ECCs). A different construction of ECCs for multiset permutations was proposed recently by Buzaglo et al. [see S. Buzaglo, E. et al., *Information Theory (ISIT), 2014 IEEE International Symposium on*, June 2014, pp. 2386-2390]. While ECCs are crucial for the practical use of RM, we found that the codes proposed in S. Buzaglo, E. et al., *Information Theory (ISIT), 2014 IEEE International Symposium on*, June 2014, pp. 2386-2390 and in F. Sala et al., *IEEE Transactions on Communications*, vol. 61, no. 7, pp. 2624-2634, July 2013 do not fit the redundancy and reliability requirements of flash memories in our experiments. Therefore an alternative ECC method is described in this document. Moreover, previous work focuses on the theoretical limits of RM, and therefore this document complements all the work mentioned above and provides practical insights.

Two different types of reading architectures for have been proposed for RM. One is based on winner-takes-all circuits to read the rank of each cell in a group [see M. Kim et al., *IEEE Int. Midwest Symp. on Circuits and Systems*, August 2012, pp. 294-297]. The more recent architecture utilizes a ramp current [see M. Kim et al., *IEEE Int. Midwest Symp. on Circuits and Systems*, August 2013, pp. 1354-1357]. While the ramp current are moving from high to low, a comparator flips its output once the cell current is higher than the ramp current. The process iterates until the rank of each cell is determined. Note that only reading circuits are constructed in the previous work, and there is no evaluation result that is publicly available.

C. Flash Characterization

Flash characterization is important for understanding the limitations of flash and the properties of noise, which lead to more efficient algorithms to optimize NAND flash performance. Mielke et al. analyzed the raw bit error rates of MLC NAND flash using 63 nm to 72 nm technologies under different types of noise [see N. Mielke et al., *IEEE International Reliability Physics Symposium*, April 2008, pp. 9-19]. Grupp et al. characterized SLCs and MLCs using 50 nm to 72 nm technologies from multiple vendors [L. Grupp et al., *42nd Annual IEEE/ACM International Symposium on Microarchitecture*, December 2009, pp. 24-33]. Yaakobi et al. characterized TLC NAND flash, and multiple LDPC codes are evaluated with the data obtained during characterization [see E. Yaakobi et al., *International Conference on Computing, Networking and Communication*, January 2012, pp. 486-491]. Cai et al. analyzed error patterns of 3x-nm MLC NAND flash [see Y. Cai, E. et al., *Design, Automation Test in Europe Conference Exhibition*, March 2012, pp. 521-526]. This work (the disclosure herein) uses the flash testing methodologies that have been practiced by the related work above. The difference is that besides characterizing conventional MLCs, this work also presents characterization results for RM. Moreover, it is believed that this work is the first work that characterizes 16 nm MLC.

D. Schemes for Improving NAND Flash Reliability

There are multiple techniques for improving flash reliability that are related to our work. ECC is a necessary component in flash-based storage systems. The most widely used ECC for flash is BCH code, more advanced ECCs such as LDPC codes are being actively evaluated by flash controller vendors [see, e.g., S. Lin and D. J. Costello, Jr., Error Control Coding (2nd Edition). Prentice Hall, 2004]. Another way to utilize ECC is through RAID. RAID has been well studied for hard disks, and has been adopted by SSDs recently. For instance, RAID has been applied across SSDs [see Y. Lee, S. Jung, and Y. H. Song, *Proceedings of the 7th IEEE/ACM International Conference on Hardware/Software Codesign and System Synthesis*, ser. CODES+ISSS '09, 2009, pp. 163-172; Y. Du et al., *IEEE International Conference on Cluster Computing*, September 2014, pp. 212-220] as well as the flash chips within an SSD [see J. Kim et al., $43^{rd}$ *Annual IEEE/IFIP International Conference on Dependable Systems and Networks*, June 2013, pp. 1-12]. The RM scheme studied in this work is one layer below ECCs. Therefore, RM is always used with ECC together. As RM reduces bit errors before ECC decoding, it helps save the coding redundancy and makes ECC more efficient.

Memory scrubbing was first used for volatile memories such as DRAM, and has recently been studied for flash storage systems by Pan et al. [see Y. Pan et al., *IEEE 18th International Symposium on High Performance Computer Architecture*, February 2012, pp. 1-10], and Cai et al. [see Y. Cai et al., *IEEE 30th International Conference on Computer Design*, September 2012, pp. 94-101]. Both studies show significant flash lifetime improvement are obtained using scrubbing. This work studies the performance of memory scrubbing in the region of archival storage. Archival storage requires low cell endurance, long data retention time and allows higher latency. These requirements are quite different from the general storage systems studied in the work above. Further, we show that both of the periodic and adaptive scrubbing methods studied in Y. Cai et al., *IEEE 30th International Conference on Computer Design*, September 2012, pp. 94-101, and generally provides higher reliability when RM is used to represent data.

Dynamic thresholding is a widely studied scheme for improving flash reliability. To select reference voltage adaptively, channel quality tracking algorithms are needed for guiding the threshold selection process [see, e.g., Y. Cai, O. et al., *IEEE 31st International Conference on Computer Design*, October 2013, pp. 123-130; N. Papandreou et al., *Proceedings of the 24th Edition of the Great Lakes Symposium on VLSI*, 2014, pp. 151-156]. To realize the tracking algorithms requires internal access to the flash chip in order to place reference voltages freely for characterizing cell voltage distributions. Note that in this work the performance of RM is compared with the best results of MLC using eight reads via RR. Since the voltages provided by RR have been optimized by chip vendors, the MLC performance reported in this document approximates that of the dynamic thresholding schemes. Moreover, the RM scheme discussed herein does not need internal access to the chip nor require dynamic tracking of the channel.

More importantly, the practicality of equipping flash memory with a modulator is explored herein. In such a scheme, data is represented in a format that is generally more robust in flash memories. This direction differs from the related work discussed above.

III. Rank Modulation

Below, RM is discussed starting with the motivations and offering a short introduction for RM. The challenges of implementing RM in flash are then discussed.

A. Motivation

Noise in flash memories introduces highly asymmetric errors, making cell voltages drift towards the same direction. There are several different types of noise which cause such errors including P/E cycling, program interference, charge leakage, and read disturb. For instance, program interference increases the voltages of neighboring cells, and P/E cycling degrades the tunnel oxide of FG, making charge be injected into FGs more easily when being disturbed.

Figure 3:
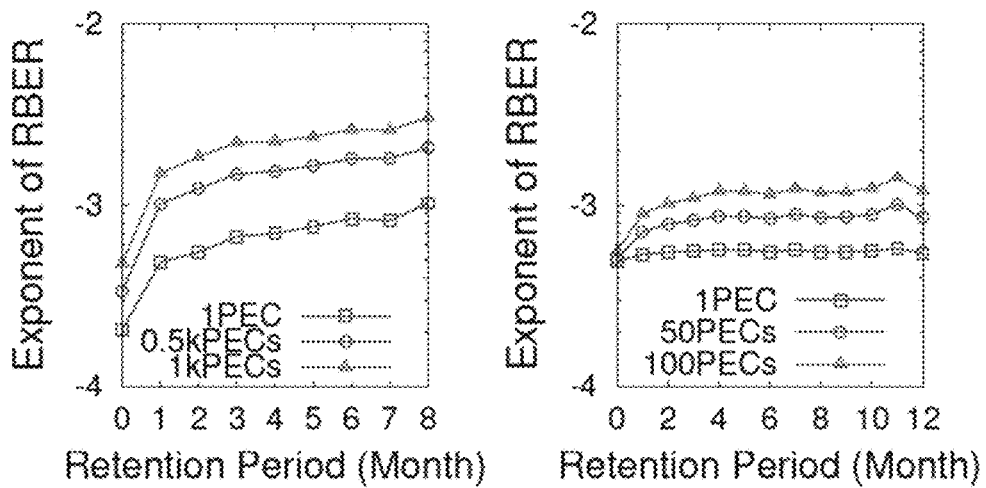
FIG. 3 is an illustration that depicts memory device RBER's, the ratio between the number of bit errors and total number of bits in a memory block of the memory device.
Figure 4:
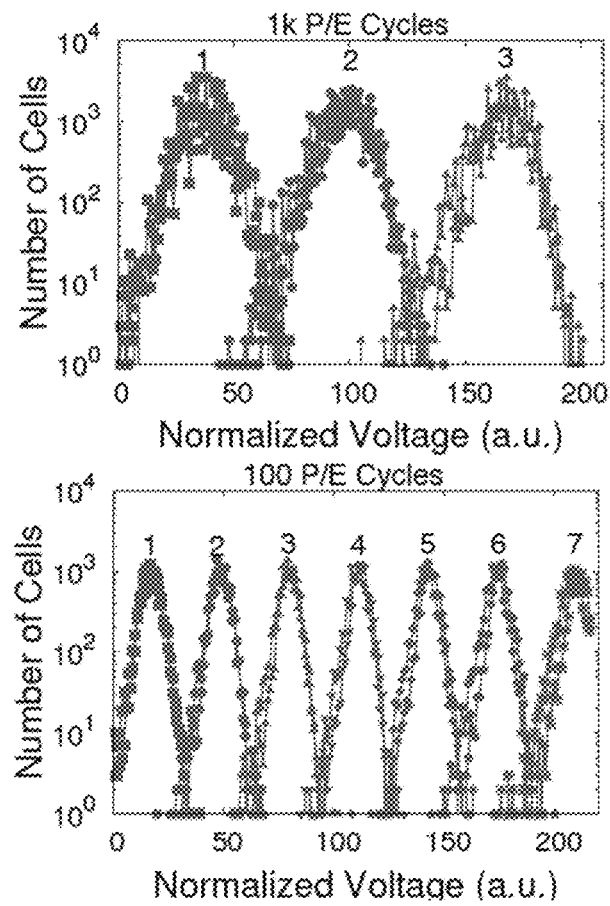
FIG. 4 is an illustration that depicts voltage drift in cell threshold charge (voltage levels).
Figure 5:
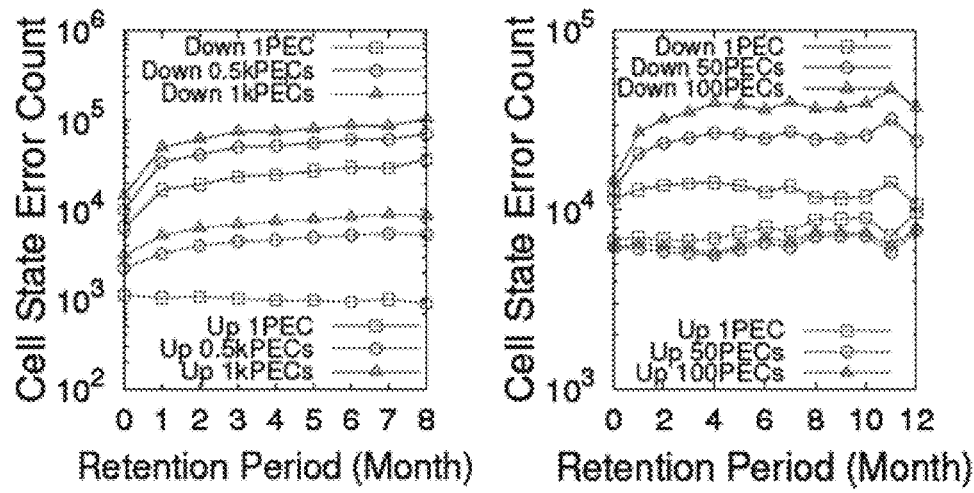
FIG. 5 is an illustration that depicts state errors according to retention period for cell memory.
Figure 6:
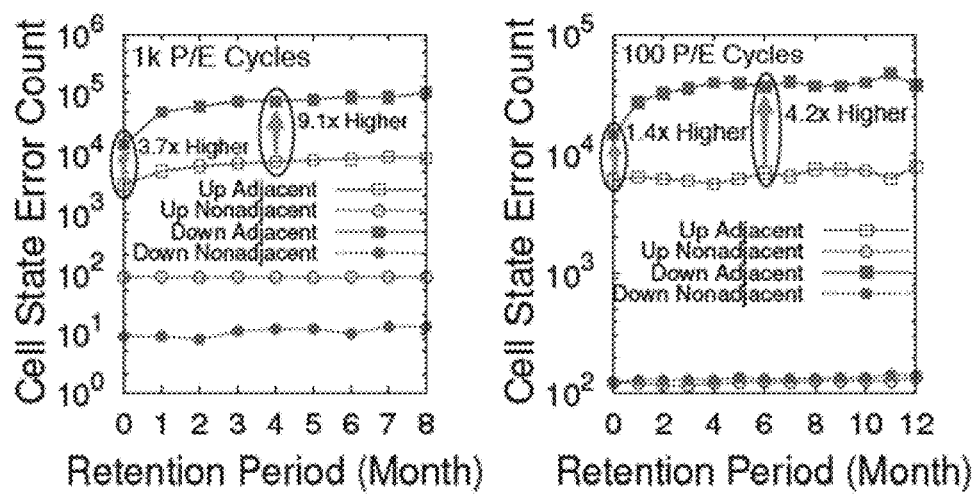
FIG. 6 is an illustration that depicts state errors according to retention period for cell memory.

FIG. 3 shows the RBERs (the ratio between the number of bit errors and total number of bits in a block) of MLC and TLC increased by 480% and 64% on average after 8-month and 12-month RPs, respectively. With standard ECCs that correct RBER ranging between $10^{-4}$ and $10^{-3}$ and reach the desired $10^{-15}$ uncorrectable bit error rate [see Y. Lee, S. Jung, and Y. H. Song, *Proceedings of the 7th IEEE/ACM International Conference on Hardware/Software Codesign and System Synthesis*, ser. CODES+ISSS '09, 2009, pp. 163-172], both flash only reliably retain data for less than a year, and thus do not immediately qualify for archival storage. The bit errors are mainly caused by downward voltage drift (FIG. 4). The drift is due to charge loss of floating gates through stress-induced-leakage-current and charge trapping of tunnel oxide?. When cell voltage drifts across predetermined reference threshold voltages (RTV), an error on the logical state/level of the cell occurs. FIG. 5 shows that on average 75% of the state errors in TLC and 92% of the state errors in MLC are downward which make cells move from level X to level Y where Y<X, and adjacent transitions (i.e., |X−Y|=1) are the dominant type of transitions (see FIG. 6). As charge loss occurs uniformly, and cell voltages drift in similar speed at moderate PECs, if the relative order of cell voltages is used for representing data, data will be more resilient to retention errors. This idea resembles the RM scheme [see, e.g., L. Grupp et al., *42nd Annual IEEE/ACM International Symposium on Microarchitecture*, December 2009, pp. 24-33].

B. Basic Concepts

RM was proposed to mitigate the noise in flash by converting data to into a format that is more resilient to asymmetric errors [see A. Jiang et al., *IEEE Trans. on Inform. Theory*, vol. 55, no. 6, pp. 2659-2673, June 2009]. FIG. 4 shows the data flow for writing and reading NAND flash with RM in SSDs. The only additions are the modulator and the demodulator compared to the data flow of conventional SSDs. The rank modulator takes in an ECC codeword, and computes the RM codeword that will be written to the flash. The reading process simply reverses the writing process.

The RM scheme is using the relative order of cell threshold voltages to represent data. When voltages shift under noise, the voltage order will largely stay the same, therefore data will receive less errors. The relative voltage order of a group of cells induces a multiset permutation—an ordered sequence of all the elements from a multiset, where the number of appearances of each element in the sequence equals the multiplicity of the element in the multiset.

Specifically, let there be N cells, and let the cells be divided into r groups of sizes $n_1, n_2, \ldots, n_r$. Denote the voltages of the cells in the i-th group by $(v_{i,1}, v_{i,2}, \ldots, v_{i,n_i})$. We require that the cells in the groups to satisfy the condition that $\forall 1 \leq i < r$, $\max\{v_{i,1}, v_{i,2}, \ldots, v_{i,n_i}\} \leq \min\{v_{i+1,1}, v_{i+1,2}, \ldots, v_{i+1,n_{i+1}}\}$, that is, among the N cells, the $r_1$ cells with the lowest voltages are assigned to the first group. Among the $(N-r_1)$ cells that are left, the $r_2$ cells with the lowest voltages are assigned to the second group, and so on. With the r divided groups, we give the definition of a RM codeword below.

Definition 1. An $(N, (n_1, n_2, \ldots, n_r))$-RM codeword formed by N cells is a length-N multiset permutation $\pi = (\pi_1, \pi_2, \ldots, \pi_N)$ of a multiset $$\{\underbrace{1, 1, \ldots, 1}_{n_1}, \underbrace{2, 2, \ldots, 2}_{n_2}, \ldots, \underbrace{r, r, \ldots, r}_{n_r}\}$$

with multiplicities $(n_1, n_2, \ldots, n_r)$ such that the i-th cell belongs to the $\pi_i$-th group. Here $\pi_i \in \{1, 2, \ldots, r\}$ is referred as the rank of the i-th cell.

Figure 14:
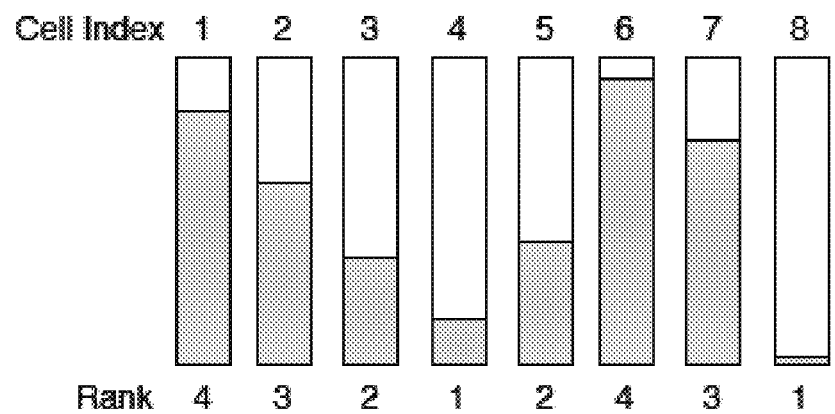
FIG. 14 is an illustration that depicts charge levels in cells of a memory device according to cell index values and corresponding rank values, in connection with Example 2.

Example 2. Example 2 is illustrated by the diagram of FIG. 14, and may be understood with reference to the following discussion. Let there be N=8 cells whose threshold voltages are shown below, and that we would like to divide them into r=4 groups with each group having 2 cells. As the threshold voltages follow the order: 8<4<3<5<2<7<1<6, therefore, cells 8 and 4 have rank 1, cells 3 and 5 have rank 2, cells 2 and 7 have rank 3, and the rest of the cells have rank 4. Therefore, the corresponding (8, (2,2,2,2))-RM codeword is (4,3,2,1,2,4,3,1), which is a multiset permutation of the multiset {1,1,2,2,3,3,4,4}.

Ideally, RM also allows overprogramming and underprogramming errors to be fixed, and makes programming more reliable. We illustrate the benefits of RM in the next example.

Example 3. Let there be N=2 cells, r=2 ranks, and let the mapping between RM codeword and binary be (1,2)⇔0 and (2,1)⇔1, that is, if the left cell has lower voltage, the RM codeword (1,2) stores bit 0, otherwise stores bit 1 (FIG. 5(a)). Assume we want to store bit 0, but the right cell is overprogrammed, making its voltage higher than the left cell (FIG. 5(b)). The overprogramming error can be mitigated by further pushing the left cell to be above the right cell (FIG. 5(c)). (In principal, a cell's voltage can be increased without block erasure.) Now assume program interference occurs (FIG. 5(d)), since the order remains, the data stored correctly reads "0". Assume charge leakage happens (FIG. 5(e)). Although both voltages decrease. The data is still correct.

In Example 3, 1 bit is stored using two cells. Therefore, the capacity is 0.5 bit/cell, which is even lower than that of SLC. In fact, the capacity of RM significantly increases with N. The following theorem characterizes the capacity of RM.

An $(N, (n_1, n_2, \ldots, n_r))$-

RM codeword stores $\left(\log_2 \dfrac{N!}{n_1! n_2! \ldots n_r!}\right) / N$ bits per cell.

Theorem 4

In this work, particular interest is directed to the balanced RM (BRM) scheme where each group has the same size, i.e., $n_1 = n_2 = \ldots = n_r = N/r$ and r divides N. BRM eases hardware implementation as reading cells of different ranks can reuse the same hardware. The next corollary shows the capacity of balanced RM for large N is almost the same as conventional r-level cells.

Corollary 5. A BRM code stores $\log_2 r$ bits/cell as $N \to \infty$.

Example 6. The table below shows the capacity scaling of BRM for r=4, 8 and 16. The unit is bits/cell.

| N/r | r = 4 | r = 8 | r = 16 |
|---|---|---|---|
| 1 | 1.15 | 1.91 | 2.77 |
| 4 | 1.6 | 2.53 | 3.48 |
| 16 | 1.86 | 2.82 | 3.81 |
| 64 | 1.95 | 2.94 | 3.93 |
| 256 | 1.99 | 2.98 | 3.98 |
| $\log_2 r$ | 2.00 | 3.00 | 4.00 |

An RM codeword is erroneous if cells are assigned with wrong ranks. In general, if the rank of a cell is wrong, at least there is another cell whose rank will be wrong. Based on this observation, it is possible to define the measure of cell errors for RM, which will be used in later evaluations.

Definition 7. Given an initial $(N, (n_1, n_2, \ldots, n_r))$-RM codeword $\pi = (\pi_1, \pi_2, \ldots, \pi_n)$ and a noisy version $\pi' = (\pi'_1, \pi'_2, \ldots, \pi'_n)$, the number of cell errors in $\pi'$ is computed by $\lceil |\{i | \pi_i \neq \pi'_i, 1 \leq i \leq n\}|/2 \rceil$.

The cell error measure above is half of the Hamming distance between an input and an output codewords. The intuition of the measure is to count the number of two adjacent rank switches. This is illustrated with the next example.

Example 8. Consider the (5, (1,1,1,1,1))-RM codeword (1,2,3,4,5) of 5 cells with their voltages being shown in FIG. 6(a). Assume charge leakage happens, resulting the cell voltages in FIG. 6(b). As the voltage order between the leftmost two cells are not distinguishable, and cell 5 has a large drop, the noisy RM codeword may become (2,1,4,5,3). Following Definition 7, there are ⌈5/2⌉=3 cell errors: one error is introduced due to the random tiebreaking between the leftmost two cells. The other two errors are due to the voltage drop of the rightmost cell.

C. Implementation Challenges

The first goal is to evaluate the effectiveness of the RM scheme in flash. which requires a flash memory to support two additional features: (1) Cell-to-cell voltage comparison for reading a permutation. Recent works [see, e.g., M. Kim et al., *IEEE Int. Midwest Symp. on Circuits and Systems*, August 2012, pp. 294-297; M. Kim et al., *IEEE Int. Midwest Symp. on Circuits and Systems*, August 2013, pp. 1354-1357] have suggested new NAND flash architectures to realize this. (2) Manipulation of the target programming voltage for a cell. Then, a permutation can be written adaptively for higher capacity. The feature may be supported in the internal testing mode of flash chips. Unfortunately, fabricating a new architecture and obtaining access to internal information of the chip are both costly and even unfeasible at this early stage of RM development.

It is possible to show that, by sacrificing some benefits while keeping the essence of the idea, RM is able to work with existing flash memories. Doing so allows exploring RM under flash noise, and comparing the performance between flash memories with and without RM.

IV. Rank Modulation for Existing Flash

An alternative approach is now proposed to program and read $(N, (n_1, n_2, \ldots, n_r))$-RM codewords for cells with r-level using the RR feature introduced in Section 2. The performance provided by this approach serves as an empirical lower bound for RM.

A. Programming

Let r be an integer power of 2. Denote the states of an r-level cell by P1, P2, ..., Pr. An $(N, (n_1, n_2, \ldots, n_r))$-RM codeword is stored in N cells by programming cells with rank i to state Pi. In practice, this requires sequentially programming the $\log_2 r$ pages sharing the same N cells with the binary bits mapped from the desired cell states using the Gray code. The next example illustrate the programming process. Algorithm 1 below specifies the reading method.

---

Algorithm 1 Write an $(N, (n_1, n_2, \ldots, n_r))$-RM Codeword

Require: r must be an integer power of 2.
Require: The first $\log_2 r$ pages ($pg_1, pg_2, \ldots, pg_{\log_2 r}$) of a WL must be available to be written to, here the very first page $pg_1$ of a WL refers to the LSB page.
1:   ($c_1, c_2, \ldots, c_N$): the N cells to be programmed.
2:   z: length-N vector, denoting the input RM codeword.
3:   b: a $\log_2 r$ by N binary matrix.
4:   for i from 1 to N do
5:       ($b_1, b_2, \ldots, b_{\log_2 r}$) ← the binary bits corresponding representing the state $P_{z[i]}$ of a cell with r levels with $b_1$ being the LSB and $b_{\log_2 r}$ being the MSB.
6:       for j from 1 to $\log_2 r$ do
7:           m[j][i] ← $b_j$
8:   for i from 1 to $\log_2 r$ do
9:       Program page $pg_i$ to store the bits (m[i][1], m[i][2], ..., m[i][N]).

---

Example 9. Let MLC use the Gray mapping in FIG. 2. To program the (7, (1,3,2,1))-RM codeword (2,1,2,3,2,4,3) using 7 MLCs, we first program the LSB page with bits (1,1,1,0,1,0,0), and then the MSB page with bits (0,1,0,0,0,1,0).

Remark 10. The adaptive programming of RM is disabled as the target threshold programming voltages of different ranks can not be changed due to lack of internal access to the flash. Programming errors are unrecoverable as current multi-level flash generally forbids rewriting without block erasure.

B. Reading

The cells storing an RM codeword are ranked approximately by RR. The multiple reference voltages provided by RR divides the whole threshold voltage interval into many bins. Each of the pages sharing the cells is read multiple times with different reference voltages. The results of multiple reads are combined to determine the bin of each cell. As the location of a bin implies the voltage interval of the containing cells, we thus rank cells by comparing their bin indices.

Algorithm 1 specifies the reading method. The v reference voltages between two adjacent states together induce (r−1) v+1 bins. Each page involved is read v times with decreasing reference voltages (Lines 6-11). Note that some pages use more reference voltages to determine output bits, e.g., the MSB pages of MLC use one voltage between states P1 and P2 and the other one between P3 and P4. When a page is read again, all the reference voltages needed by a page shift together to use the next lower values that are available. The bin of each cell is computed following a predetermined mapping between bit string generated from multiple reads and bin index (Lines 12-13). The bin indices are sorted (Lines 14-15), and the ranks are assigned according to the sorted order (Lines 16-20). The next example (Example 11) illustrates Algorithm 2 for reading using MLC.

---

Algorithm 2 Read an (N, ($n_1$, $n_2$, ... , $n_r$))-RM Codeword

---

1: ($c_1$, $c_2$, ... , $c_N$): the N cells to be read.
2: ($pg_1$, $pg_2$, ... , $pg_{log_2 r}$): the $log_2 r$ pages sharing the same cells, with $pg_1$ being the LSB page.
3: v: the number of reads used for each page.
4: m: a $vlog_2 r$ by N binary matrix.
5: x, y, z: length-N integer vectors.
6:   a ← 1
7:   for i from 1 to $log_2 r$ do
8:     for j from 1 to v do
9:       Read $pg_i$ with the j-th highest reference voltage(s).
10:       Store the output bits in the a-th row of m.
11:       a ← a + 1
12:   for i from 1 to N do
13:     x[i] ← the index of the bin mapped from the bit pattern (m[1][i], m[2][i], ... , m[$vlog_2 r$][i]) of $c_i$.
14:   for i from 1 to N do
15:     y[i] ← the index of the cell whose bin index is the i-th smallest element of x with ties
being broken randomly.
16:   a ← 1
17:   for i from 1 to r do
18:     for j from 1 to $n_i$ do
19:       z[y[a]] ← i
20:       a ← a + 1
21:   Output z as the RM codeword.

---

Figure 7:
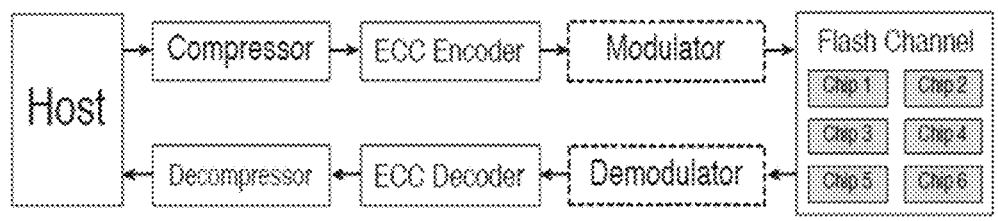
FIG. 7 is a block diagram of a memory device constructed in accordance with this disclosure.
Figure 8:
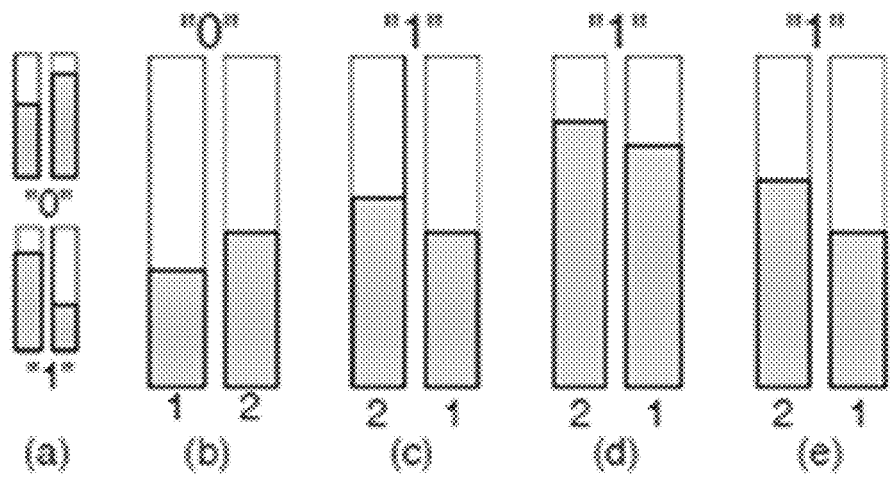
FIG. 8 is an illustration that depicts charge levels of a Rank Modulation memory according to different types of errors.
Figure 9:
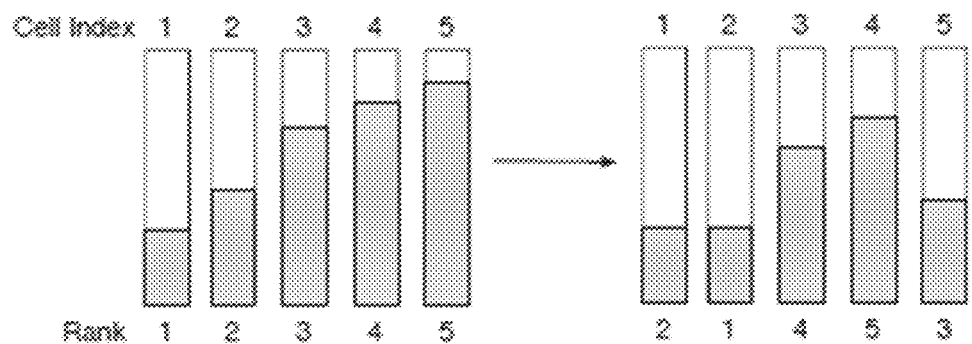
FIG. 9 is an illustration that depicts cell errors in a Rank Modulation codeword.
Figure 10:
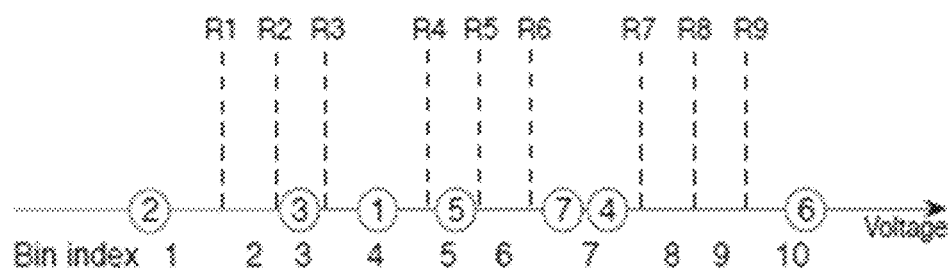
FIG. 10 illustrates reading a Rank Modulation codeword with the read-retry technique.

Example 11. We continue with Example 9 by reading the codeword. As shown in FIG. 7, let RR provide v=3 reference voltages between two states, and let the bins be labelled with indices from 1 to 10. Let the cells have the voltages shown in the figure. LSB is first read three times using the reference voltages following the order R6, R5, R4. Then MSB page is read with reference voltage pairs following the order (R3, R9), (R2, R8), (R1, R7). The matrix m generated by multiple reads is in Table 1. We use s=($m_3$, $m_2$, $m_1$, $l_3$, $l_2$, $l_1$) to denote the bits obtained by reading a cell multiple times, where $m_i$ and $l_i$ are the values of the MSB and the LSB stored by the cell output by the i-th reads, respectively.

TABLE 1

The output bits of each read. The numbers in the first row are cell indices.

| Reference | 1 | 2 | 3 | 4 | 5 | 6 | 7 |
|---|---|---|---|---|---|---|---|
| R6 | 1 | 1 | 1 | 0 | 1 | 0 | 0 |
| R5 | 1 | 1 | 1 | 0 | 1 | 0 | 0 |
| R4 | 1 | 1 | 1 | 0 | 0 | 0 | 0 |
| (R3, R9) | 0 | 1 | 1 | 0 | 0 | 1 | 0 |
| (R2, R8) | 0 | 1 | 0 | 0 | 0 | 1 | 0 |
| (R1, R7) | 0 | 1 | 0 | 0 | 0 | 1 | 0 |

Table 2 below shows the mapping between s and bin index. For each cell, we take the bit sequence stored in the corresponding column of m, and look up its bin index, obtaining the bin indices (4,1,3,7,5,10,7). Sorting the bin indices gives cell indices in the ascending voltage order (2,3,1,5,7,4,6). Given $n_1$=1, $n_2$=3, $n_3$=2, $n_4$=1, cell 2 gets rank 1, cells 1, 3, 5 get rank 2, cells 7 and 4 get rank 3, and cell 6 gets rank 4.

TABLE 2

Mapping between bin index and s.

| s | Index | s | Index |
|---|---|---|---|
| (1, 1, 1, 1, 1, 1) | 1 | (0, 0, 0, 0, 0, 1) | 6 |
| (0, 1, 1, 1, 1, 1) | 2 | (0, 0, 0, 0, 0, 0) | 7 |
| (0, 0, 1, 1, 1, 1) | 3 | (1, 0, 0, 0, 0, 0) | 8 |
| (0, 0, 0, 1, 1, 1) | 4 | (1, 1, 0, 0, 0, 0) | 9 |
| (0, 0, 0, 0, 1, 1) | 5 | (1, 1, 1, 0, 0, 0) | 10 |

C. Modulation and Demodulation Algorithms

The data flow in FIG. 3.2 is completed by specifying the algorithms of the modulator and the demodulator. The algorithms provide conversions between binary ECCs and RM codewords. Two classes of modulation and demodulation algorithms designed for different granularities of page programming or availability of input data are proposed. The algorithms will be described mainly in terms of MLC for simplicity.

Modulation Algorithm I Assume only one page of input data is available to the modulator. Then separate modulations can be carried out for each page that belongs to the same WL. Such constraints are often found in MLC or SLC flash, where only one page of input data is required for each programming. In MLC, if the input data is for an LSB page, the modulator takes in a length-N ECC codeword, and output a length-N RM codeword using only two ranks. The cells to store bit 1 have rank 1, and the other cells have rank 2. (In MLC, a cell whose LSB is 1 is either in P1 or P2, whose voltage is lower than those of the cells at P3 and P4.) If the input data will be stored in an MSB page, the modulator first decodes the corresponding ECC bits in the paired LSB page. (LSB is programmed before MSB in flash.) Together with the input ECC codeword for the MSB page, the cells form a RM codeword with 4 ranks. The rank of each cell is the cell level that corresponds to the LSB and the MSB stored in the cell.

Handling Unbalanced RM Codeword In practice, the number of cells in each rank $n=(n_1, n_2, \ldots, n_r)$ may not be the same due to the arbitrary binary ECC bits that the RM codewords to be mapped from. We call such RM codewords unbalanced RM codewords (URMCs), and call the sequence n the rank information (RI) of a RM codeword. In order to read an URMC, the RI of the codeword needs to be given to the reader. Therefore, after generating RM codewords for a page, metadata are created to record the number of cells in each rank. In MLC where $r=4$, we record only $n_1$ (or, $n_2$) for RM codewords on LSB pages, and $n_1$ and $n_3$ (or, $n_2$ and $n_4$) for codewords on MSB pages. All metadata are converted to binary. It is easy to show that such metadata are sufficient for reassemble n. An RM codeword and its metadata are stored together in a page where RM codeword sits in the data area, and metadata will be written to the spared area. Furthermore, we group all the metadata in a page together, compress them, and protect them with ECC that has a lower rate than the ECC used for the user data.

Demodulation Algorithm I Demodulation is the reverse of the modulation. To retrieve a length-N ECC codeword from an LSB page, the metadata is first decoded to compute $n_1$ and $n_2$. Then, Algorithm 1 is applied to read out the N, $(n_1, n_2)$-RM codeword. After that, we map rank 1 to bit 1, and rank 2 to bit 0, yielding the output ECC codeword.

To retrieve an ECC codeword from an MSB page, we decode the metadata for the corresponding ECC codewords in the paired LSB page and the MSB page. This recovers $n_1$, $n_2$, $n_3$ and $n_4$ for the RM codeword formed by both pages. Then, we apply Algorithm 1 to read the (N, $(n_1, n_2, n_3, n_4)$) codeword from the LSB and the MSB pages. We output the ECC codeword in the MSB page by assigning bit 0 to cells with rank 2 and 3, and bit 1 to the rest of the cells.

Modulation Algorithm II Now let us assume the data for all the pages of a wordline are available at the time of modulation. Such constraint are often found in TLC and beyond, where more than one WLs' input data are required to be available to the programming command in order to reduce the cell-to-cell interference. The constraints may also be raised from MLC as the input data of a WL are typically buffered by flash controller.

To modulate, the data of each page in a WL are combined together to calculate the RM codewords. The binary bits of each cell are first mapped to the traditional cell levels following the Gray mapping used by existing NAND flash. We then split the cell levels into consecutive size-N chunks, and directly view each chunk as a length-N rank modulation codeword. Similar to Modulation Algorithm I, we also need to save the RI of each URMC as metadata. For each RI n, we only store the binary bits that correspond to $(n_1, n_2, \ldots, n_{r-1})$. ($n_r$ can be automatically deduced.) The metadata bits of all the RM codewords in the WL are concatenated together, compressed and protected with ECC. The ECC codewords are then evenly split into $\log_2 r$ chunks, and are written into the spared area of each page of the WL.

Demodulation Algorithm II To demodulate, we read out the data stored in the spared area of each page, and reassemble the metadata. Decoding of metadata outputs the RI of each URMC. With the computed RI, we use Algorithm 4.2 to output each URMC stored in the same wordline. Each RM codeword symbol is then converted to cell level, which is further mapped back to $\log_2 r$ binary bits following the Gray mapping. The output bits form a noisy copy of the initial input ECC bits.

Note that a lazy demodulation can be implemented in practice which first reads an ECC codeword and checks if it decodes. Upon failure, demodulation can be used. Moreover, as demodulation of an MSB page produces the bits in the paired LSB page, a caching scheme can be used to buffer the LSB page when a MSB page is read, and immediately returns the LSB data when needed.

D. Further Optimizations

As mentioned, a cell error can be introduced to a RM codeword when two cells initially assigned with different ranks are found in the same bin. If random tiebreaking is unlucky, the ranks of the two cells will switch, and one bit error will be introduced to each cell after demodulation. A further optimized RM reading algorithm is proposed, which reduces the number of bit errors due to lack of resolution. This algorithm is referred to as Adaptive Rank Reading (Algorithm 3).

---

Algorithm 3 Adaptive Rank Reading

---

Require: $N = \Sigma_{i=1}^{r} n_i$
Ensure: The rank $r_j$ is assigned for all j from 1 to N
    $b \leftarrow 0$     //bin index (1 is the lowest reading bin)
    $l \leftarrow 1$     // rank to assign
    for i from 1 to r do
        $\bar{n}_i \leftarrow n_i$     // temporary metadata
    $\bar{N} \leftarrow 0$     // number of cells already assigned
    while $\bar{N} < N$ do
        $S \leftarrow \emptyset$
        while $S = \emptyset$ do
            $b \leftarrow b + 1$     // increment bin index
            $S \leftarrow$ the set of cell indices in bin b
        for all $j \in S$ do
            if $\bar{n}_l > |S|/2$ then
                $r_j \leftarrow l$
            if $\bar{n}_l < |S|/2$ then
                $r_j \leftarrow l + 1$
            if $\bar{n}_l = |S|/2$ then
                $r_j \leftarrow$ pick l or l + 1 randomly
        // now update temporary metadata
        $k \leftarrow |S|$
    while $k > 0$ do
        if $\bar{n}_l > k$ then
            $\bar{n}_l \leftarrow \bar{n}_l - k$
            $k = 0$
        else
            $k = k - \bar{n}_l$
            $\bar{n}_l \leftarrow 0$
            $l = l + 1$
    $\bar{N} \leftarrow \bar{N} + |S|$

---

Adaptive rank reading Algorithm 3 above specifies an improved RM reading algorithm. Specifically, assume we have n cells found in the same grid, and we can only assign k of them to rank i, and give the rest of them to rank i+1. Instead of using random tie breaking, we choose to assign all the n cells to the same rank. The rank to be assigned is determined by voting: if k>n−k, rank i is assigned, otherwise rank i+1 will be assigned. Note that, once the adaptive reading is used, we also update the number of the cells in each rank. The next example illustrates Algorithm 3.

Example 12. We use a (7, (1,3,2,1))-RM scheme with 10 bins. We find that cells 1, 2 and 3 are in bin 3, cell 5 is in bin 5, cells 4 and 7 are in bin 7, and cell 6 is in bin 10. The rest of the bins are empty. Algorithm 4.4 starts by assigning the temporary metadata $(\bar{n}_1,\bar{n}_2,\bar{n}_3,\bar{n}_4)=(1,3,2,1)$. After assigning the set S to be empty, the algorithm increment the bin index until bin b=3, in which S takes the value (1,2,3). The algorithm then finds that $\bar{n}_1=1$ is smaller that $|S|/2=3/2$, and therefore assigns $r_1$, $r_2$ and $r_3$, the ranks of cells 1, 2 and 3, to the value l+1=2.

Next, the algorithm updates the temporary metadata. It first find that $\bar{n}_1=1$ is not greater then k=3, and thus updates k to 3−1=2, and $\bar{n}_j=\bar{n}_1$ to 0. The algorithm then increment l to 2, and reiterate the while loop. In the second iteration, the algorithm finds that $\bar{n}_2=3$ is greater than k=2, and thus it updates $\bar{n}_2$ to 1, and k to 0, finishing the while loop. The algorithm then updates $\bar{N}$ to 3, and continue to the next bins.

Theorem 13. Let a Gray mapping be used between rank and binary, and let there be n cells found in the same bin. If we know that k of the cells belongs to rank i, and the rest belongs to rank (i+1). Algorithm 1 introduces 2 min{k, n−k} bits errors, and Algorithm 4.4 introduces min{k, n−k} errors to the binary data correspond to the output codeword.

Error correction with metadata The metadata updated by operation of Algorithm 3 can be used to correct more bit errors. Assume n cells are found in the same bin, and our algorithm assigned rank i to all of them, and further assume that comparing the initial and the updated metadata suggests one cell should be given rank i+1. To find this cell, a quick enumeration can be used, and the error detection algorithm of the ECC is used to verify if the guess is correct. This method can be easily extended to efficiently (i.e. in O(N) time) correct any error on RM codeword symbols that introduces at most 1 bit error in the corresponding data from each of the page that shares the same WL.

Reference threshold voltage calibration The reliability performance of RM can be further improved by calibrating the RTVs used during demodulation. Errors introduced by demodulator are mainly caused by the cells whose threshold voltages fall in the overlap region between two adjacent $V_t$ distributions. Placing the reference voltages in those regions will provide a better resolution for estimating the analog voltages of those problematic cells, and thus ranks will be assigned to those cells more precisely. As the overlap regions gradually shift with the number of PECs and retention period, we need to constantly keep track of the region, and gradually adjust the RTVs' locations for better performance.

simple online calibration method is proposed. In this method, one wordline is used to store a sequence of "pilot" RM codewords mapped from pseudo-random input binary data generated using a fixed seed. In practice, the seed can be a combination of the block address as well as the index of the WL. Any WL in a block may be chosen for storing the pilot data. We also need to make sure that pilot data and user data that will be read using the calibrated RTVs are stored together in the same kind of blocks, that is, the blocks that have carried almost the same number of P/E cycles, and will experience the same amount of retention period.

The idea of the online calibration method is to empirically find the best sets of RTVs that yields the minimum number of bit errors when reading the pilot RM codewords. To do so, we first measure the $V_t$ distributions for the pilot wordline using read-retry and the genie input RM codewords regenerated using the seed we have chosen. The distributions provide the number of cells of different levels in each bin. With the distribution data, we create a virtual flash channel where we can test the bit error rates of RM reading using different RTV settings. The space for enumeration has four dimensions, namely, the number of RTVs used between two adjacent distributions, the gap between two adjacent reference voltages placed in the same overlap region, the overlap region where a sequence of voltages will be placed, and the location of the first reference voltage to be placed in a given overlap region.

Notice that the enumeration space is still small in practice: there are only three overlap regions for MLC and seven for TLC; The number of starting RTV locations ranges from 5 to 10, the number of different practical voltage gaps is between 2 to 6, and the typical number of voltages to be used in each region is between 2 and 4. Reading the RM codewords from the virtual channels using different voltage combinations in the space yields different bit error rates, and the ones that have the best performance will be chosen. In case there is a tie (which happens quite frequently when the cells are relatively new), tiebreaking is done by choosing the voltage combination whose central voltage is closer to the center of the overlap region.

The proposed calibration methods are specifically designed for archival data storage, where large chunks of data are written together to flash, and only one WL of pilot data is needed for each big chunk. In such scenarios, the space overhead is negligible.

E. Discussion

The proposed methods are simple to implement in recent NAND flash memories. Note that we also lose a few benefits of the initial RM scheme as pointed out in the remarks above. However, our methods still keep the core benefits of RM. Moreover, the reliability of RM and conventional data representations can be easily compared under the same noise of the latest flash memories. These comparisons will significantly deepen our understanding of RM in practice.

VI. Rank Modulation Based Archival Storage

In this section, we first discuss the motivation of flash-based archival storage. Then, we propose modulation and demodulation algorithms for RM that are suitable for SSDs. Finally, we evaluate the performance of RM scheme for archival storage.

A. Archival Storage with Flash

Recent development in NAND flash based storage makes flash become appealing for archival storage. Archival data once written are not likely to be read in the future, conventional archival storage systems thus use tape and hard disk drive (HDD) as storage media to provide high capacity and reasonable access speed. As the density of NAND flash grows, SSD is rapidly catching up with HDD on capacity and price. More importantly, flash memory naturally offers random data access, which enables very efficient data deduplication [B. Debnath et al., *Proceedings of the USENIX Annual Technical Conference*, 2010] and data compression algorithms for even higher capacity. Interestingly, Facebook recently posed the challenges on using cheap flash for "cold storage" to store aged photos, videos and user updates that are rarely accessed nowadays to save costs in their data centers [J. Taylor, *Proceedings of Flash Memory Summit*, 2013, pp. 1285-1290]. Very recently, Gupta et al. show that SSD-based archival storage are very cost competitive to HDD-based systems for long term data retention [P. Gupta et al., *Proceedings of the 22th IEEE International Symposium on Modeling, Analysis, and Simulation of Computer and Telecommunication Systems*, September 2014].

However, flash memories with high density are less reliable. The required long term data retention time brings a large number of charge leakage errors to cells, causing ECC failure. A commonly used solution for mitigating retention errors is memory scrubbing (MS) [Y. Pan et al., *IEEE 18th International Symposium on High Performance Computer Architecture*, February 2012, pp. 1-10; Y. Cai et al., *IEEE 30th International Conference on Computer Design*, September 2012, pp. 94-101], namely, flash controller periodically reads data, corrects errors, and writes the corrected data back to flash so that the uncorrectable bit error rate (UBER) stays below $10^{-15}$.

In flash-based archival storage, write and read traffic mainly comes from MS since data are rarely accessed by user. With a reasonable scrubbing frequency, a memory cell only needs to survive a small number of P/E cycles. For instance, to achieve 100-year data retention period, and assume a block is every 6 months, then the required cell endurance is about 200 P/E cycles. Observing that RM provides much lower RCERs at small P/E cycles, we apply RM to archival storage. By experimenting with high density NAND flash, we show that RM achieves substantially longer data retention time than conventional MLC under two commonly used MS schemes.

B. Evaluation using 16 nm MLC

The focus of our experiments is to compare the maximum data retention time provided by RM and conventional MLC using the same amount of coding redundancy. The flash memories used in the experiments of this section are 64 Gb MLC flash from vendor B manufactured on 16 nm technology node, which is the most advanced NAND flash from this vendor. The chip has page size 16 KB, and supports 8 reference voltages between two adjacent states. To read RM codeword, we used 4 reference threshold voltages among the 8 available voltages between two states, and again made the selected voltages as far apart from each other as possible. We made MLC use all the 8 RR options and selected the output given by the best read using genie data.

Both RM and conventional MLC used BCH code as ECC with code length N=2047. The metadata of RM codewords were compressed using Huffman code, and were protected using BCH code. The code rates of RM for LSB and MSB pages which measure the ratio between the number of user data bits and the total number of bits used by a codeword are given by $R_{lsb}=Nr_{ecc}/(N+r_{h1}\lceil \log_2 N\rceil/r_{meta})$ and $R_{msb}=Nr_{ecc}/(N+2r_{h2}\lceil \log_2 N\rceil/r_{meta})$ where $r_{ecc}$ is the rate of the BCH code which protects user data, the rates $r_{h1}$ and $r_{h2}$ are the average compression rates for the metadata of LSB and MSB pages, respectively. $r_{meta}$ is the rate of the BCH code for protecting metadata. The average rate $R_{RM}$ of the RM scheme is given by $(R_{lsb}+R_{msb})/2$. For conventional MLC, the code rate $R_{MLC}$ simply equals the code rate of the ECC used for its user data. For performance comparison, we made both schemes have the same coding redundancy, namely, $R_{MLC}=R_{RM}$.

To emulate the noise in archival storage, we cycled the blocks up to only 1000 P/E cycles. At each sampling P/E cycle, we sequentially write the ECC codewords of pseudo-random data into the blocks using RM and conventional MLC, and saved those ECC codewords as genie data. These data are considered as the data written due to MS. Then, we baked the chips to emulate up to one year enterprise class data retention following the JEDEC standard ["Solid state drive (SSD) requirements and endurance test method," http://www.jedec.org/standards-documents/docs/jesd218a, 2014]. Therefore, we are able to emulate the errors for different scrubbing periods up to one year.

After each baking, the ECC codewords were read and compared with the genie data to calculate raw bit error rates (RBERs). For instance, the RBER measured at P/E cycle=60 and 1-month data retention corresponds to the bit error rate that a monthly MS algorithm faces at the time when the archival data have been preserved for five years. In order to recover the errors, the correction capability t of the ECC for user data need to selected to make UBER smaller than $10^{15}$, where UBER is calculated by $$\text{UBER}=(\Sigma_{c=t+1}^{N}(_{c}^{N})\text{RBER}^{c}(1-\text{RBER})^{N-c})/N.$$

We studied the performance of RM and conventional MLC using two common scrubbing schemes. The first scheme is periodic scrubbing, which refreshes a block with a fixed frequency. The second scheme refreshes block adaptively [Y. Cai et al., *IEEE 30th International Conference on Computer Design*, September 2012, pp. 94-101], by increasing frequency at higher P/E cycles.

Scrubbing with fixed period. We used 0.5 month, 1 month, and 6 months as scrubbing period $t_s$, and 10 years and 30 years as data retention time $t_r$. We let $r_{meta}=0.90$, and $r_{h1}$ and $r_{h2}$ were experimentally measured to be 0.67. Table 3 lists the required P/E cycles given different $t_s$ and $t_r$.

TABLE 3

P/E cycles needed for different $t_s$ and $t_r$.

| $t_r$ | $t_s$ = 0.5 m | $t_s$ = 1 m | $t_s$ = 6 m |
|---|---|---|---|
| 10 years | 240 | 120 | 20 |
| 30 years | 720 | 360 | 60 |

The data obtained from the baking experiments characterize the RBER functions $f_{RM}(\text{PEC, T})$ and $f_{MLC}(\text{PEC, T})$ of P/E cycle PEC and baking time T for RM and MLC, respectively. To determine the rate of each scheme's ECC which protects user bits, we first took the RBER data of RM, and compute the minimum correction capability $t_{RM}$ of the ECC for RM-based MS to reach a target P/E cycle $\text{PEC}_{RM}$ in Table 4 corresponding to some $t_s$ and $t_r$, namely, $t_{RM}$ is the minimum correction capability that makes UBER<$10^{-15}$ under RBER $f_{RM}(\text{PEC}_{RM}, t_s)$. Then, $t_{RM}$ further determines $r_{ecc}$ and $R_{RM}$. As we assume $R_{MLC}=R_{RM}$ in our comparison, we can determine the correction capability $t_{MLC}$ for the ECC of the MLC-based MS. By finding the maximum RBER $\text{RBER}_{MLC}$ that MLC can cover to reach the same UBER promised by the RM-based MS, we can determine the P/E cycle $\text{PEC}_{MLC}$ by approximating the solution of $f_{MLC}(\text{PEC}_{MLC}, t_r)=\text{RBER}_{MLC}$ using the RBER data of MLC. And the maximum retention time that MLC can provide with the same coding redundancy $\text{PEC}_{MLC} \cdot t_s$, which is compared to the time $t_r$ that achieved by the RM-based MS. Table 4 lists the computed correction capabilities and rates of the ECCs of both schemes for the same-redundancy comparisons.

TABLE 4

The ECC rates and correction capabilities for same redundancy comparisons. Each tuple is orderedby ($r_{ecc}$, $t_{RM}$, $R_{MLC}$, $t_{MLC}$).

| $t_r$ | $t_s$ = 0.5 m | $t_s$ = 1 m | $t_s$ = 6 m |
|---|---|---|---|
| 10y | 0.951, 9, 0.947, 10 | 0.951, 9, 0.947, 10 | 0.951, 9, 0.947, 10 |
| 30y | 0.941, 11, 0.936, 12 | 0.941, 11, 0.936, 12 | 0.951, 9, 0.947, 10 |

Figure 11:
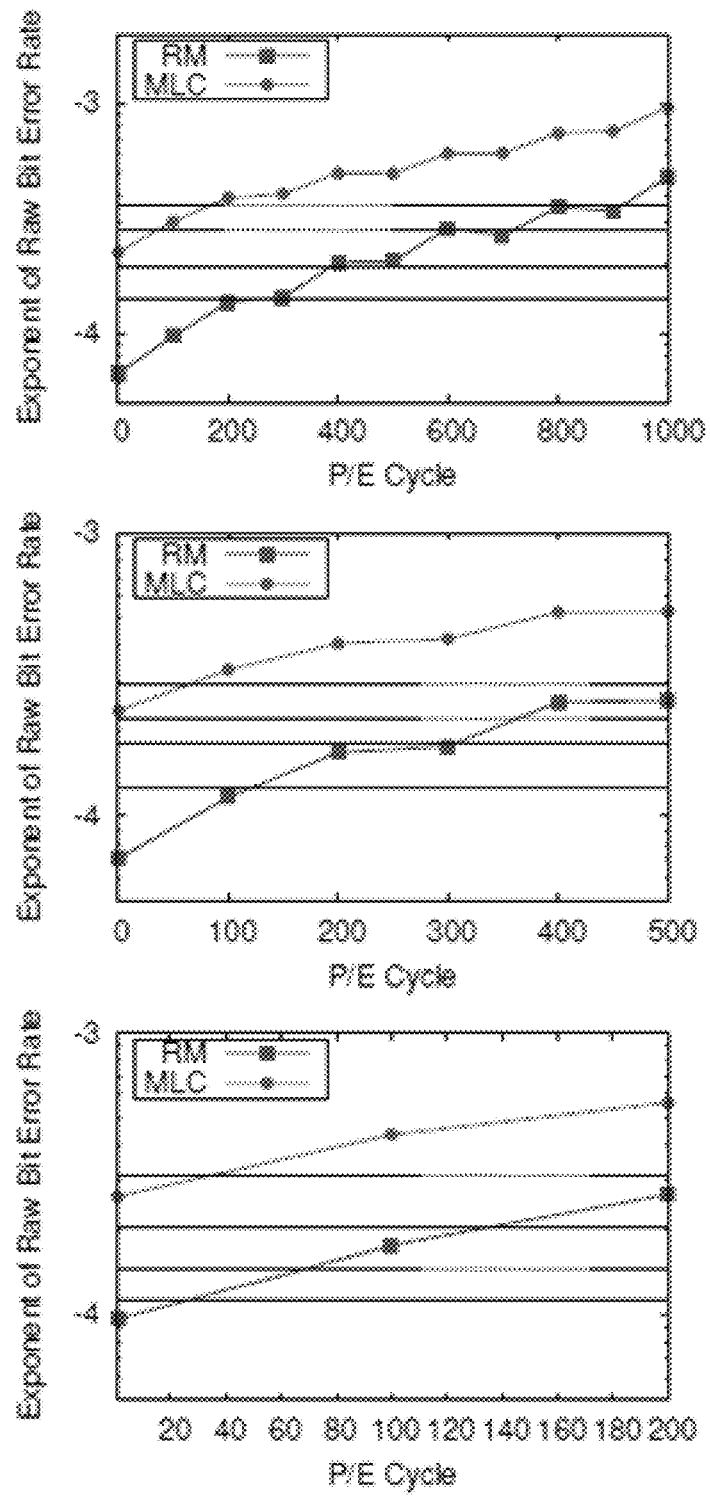
FIG. 11 illustrates RBER's of memory devices according to different retention periods.
Figure 12:
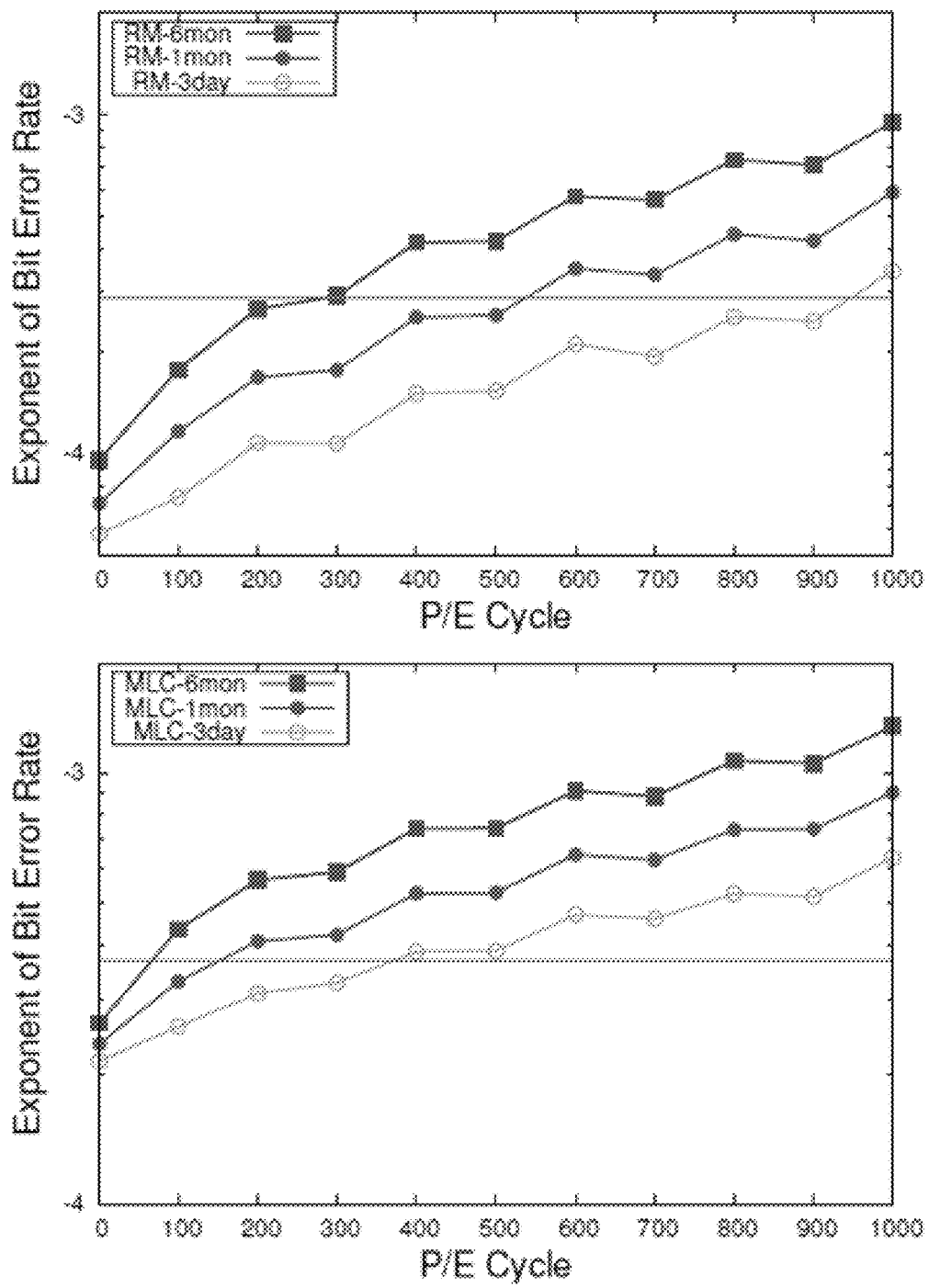
FIG. 12 illustrates adaptive scrubbing performance of memory using Rank Modulation and of a MLC memory device.

FIG. 11 shows the RBER data of RM and MLC after 0.5-month, 1-month and 6-month data retention. The lower horizontal solid line and dashed line correspond to the RBERs that can be tolerated by the BCH code of RM to achieve 10-year and 30-year data retention time, respectively. The higher solid line and dashed line correspond to the RBERs that the ECC of MLC can tolerate using the same redundancy of RM. The maximum P/E cycles $PEC_{MLC}$ that MLC can support under different scrubbing periods can be obtained from the intersection between the RBER lines and the RBER curves of MLC. We summarize the maximum retention time of the MLC scheme in Table 6 given RM can achieve 10 year and 30 year retention. For $t_r=10y$, the RBERs of MLC are always larger than the RBER that MLC's ECC can handle, therefore with the same coding redundancy, the MLC scheme can not be used in this setting. For $t_r=30y$, RM obtained up to 6 times data retention time improvements.

TABLE 5

The maximum data retention time supported by conventional MLC, and the improvements of RM over MLC.

| $t_s$ | $t_r = 10y$ | Improvement | $t_r = 30y$ | Improvement |
|---|---|---|---|---|
| 0.5 m | 0y | N/A | 7.17y | 4.2x |
| 1 m | 0y | N/A | 5y | 6x |
| 6 m | 0y | N/A | 15.5y | 1.93x |

Figure 13:
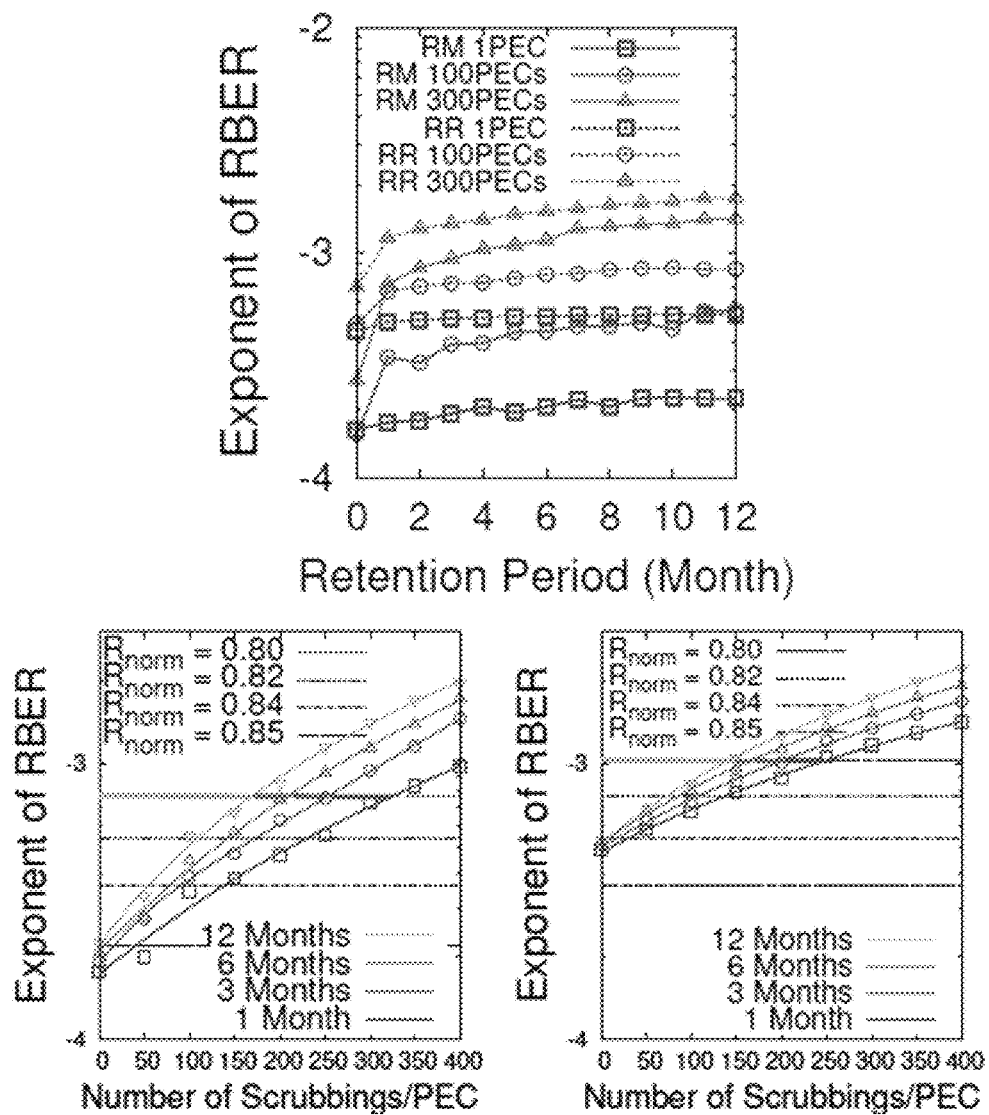
FIG. 13 illustrates adaptive scrubbing performance of a TLC memory device using Rank Modulation and Read-Retry.

Adaptive scrubbing Since the number of errors is smaller at the very beginning of data retention, an adaptive scrubbing with increasing scrubbing frequency can be used. FIG. 13 shows the performance of adaptive scrubbing in MLC and RM. Each curve in the figure shows the RBER at different P/E cycles with fixed scrubbing periods. Three scrubbing periods are used: 3 days, 1 month and 6 months. For RM, we let the user data be protected by a BCH code correcting 10 errors. The correction capability of the BCH code for MLC is set to 11 errors for same redundancy comparisons. The horizontal lines in the figure mark the RBER that each ECC is able to correct. If a curve is below a horizontal line for a range of P/E cycles, then the corresponding scrubbing frequency can be used for reliable data recovery. We let adaptive scrubbing always use the lowest frequency that is available. From the results, we can see that for RM 6-month scrubbing period is used from 0 to 300 P/E cycles, 1-month period is used from 301 to 530 P/E cycles, and 3-day period is used from 151 to 940 P/E cycles, therefore, the total retention period is about 172.6 years. Compared to MLC which only covers 39.3 years, RM provides 4.4× longer data retention time with the same coding redundancy.

C. Evaluation Using 19 nm TLC

FIG. 13 shows the RBERs of reading 19 nm TLC with RM using 4 RTVs between adjacent logical states and 512 cells in each group. For comparison purposes, we let cells be read using read-retry (RR), where each page was sensed using 31 sets of RTVs optimized for retention by the vendor, and the read that yielded the least errors for each page was chosen. This approach resembles a class of dynamic thresholding schemes [N. Mielke et al., *IEEE International Reliability Physics Symposium*, April 2008, pp. 9-19]. Measurements show that using RM yields 60%, 46% and 27% lower RBERs for blocks that carried 1, 100, and 300 PECs, respectively, and thus provides higher reliability for flash with moderate PECs. This property is particularly attractive to archival applications.

Table 6 compares the RPs of MS using RM and RR estimated using FIG. 13. ECCs with multiple code rates were considered. RM-based MS provides up to 196 years of RP for fresh blocks, and up to 146 years of RP for aged blocks which had carried 50 PECs before storing the test data, outperforming RR-based MS by 18% and 26%, respectively. Similar encouraging results were also obtained for MLC, which we skip for space reasons.

Figure 15:
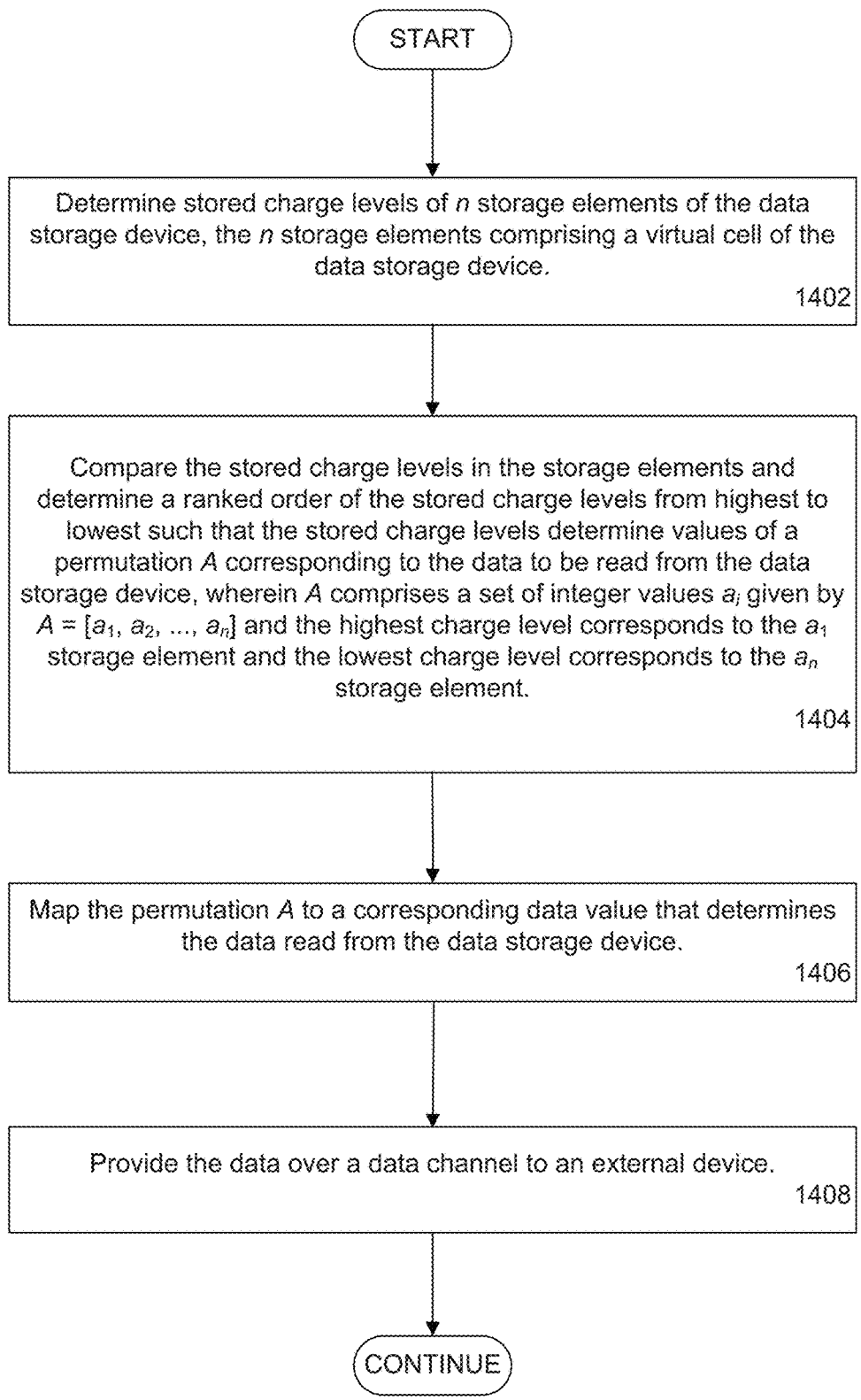
FIG. 15 is a flow diagram that shows reading operations of a data storage device constructed in accordance with the description herein.

FIG. 15 is a flow diagram that shows the operations of a data storage device using the rank modulation coding scheme as described herein. The data storage device may comprise a variety of systems and components, whether as a device external to computing devices for data storage, or integrated with other components of a system for data storage. The data storage device may be implemented, for example, as a Flash memory external device, such as a USB-compatible "thumb drive" or the like, or the storage device may be implemented as an internal component such as a "solid state drive" (SSD) for use in place of a hard disk drive in desktop and laptop computers. The data storage device receives data for programming (storage) from a host device, and provides data read from the data storage to a host device. Data passes to and from the data storage device over a data channel. For example, in the case of a thumb drive, the host device may comprise the computing device with which the thumb drive communicates via the USB data channel, and in the case of the SSD, the host device may comprise the SSD controller that manages the data interface to an associated system bus of a computer in which the SSD is installed.

A data storage device that operates in accordance with the rank modulation scheme determines a permutation of a codeword that corresponds to a data value. That is, such a device represents permutations as cells such that a group of cells represent a single virtual cell associated with a permutation corresponding to data. This is illustrated by the flow chart box 1502 of FIG. 15, which shows that the device receives a binary representation from a host interface, the binary representation comprising a data value to be encoded into a rank modulation codeword, wherein the rank modulation codeword represents a state P of N cells, such that each cell N stores a charge and has a state represented by up to r charge levels. At box 1504, the device next maps each binary representation of the data value to a state P of one of the N cells in sequence of the data value bits. Then, at box 1506, the values of the N cells are provided to a data destination over an information channel.

Figure 16:
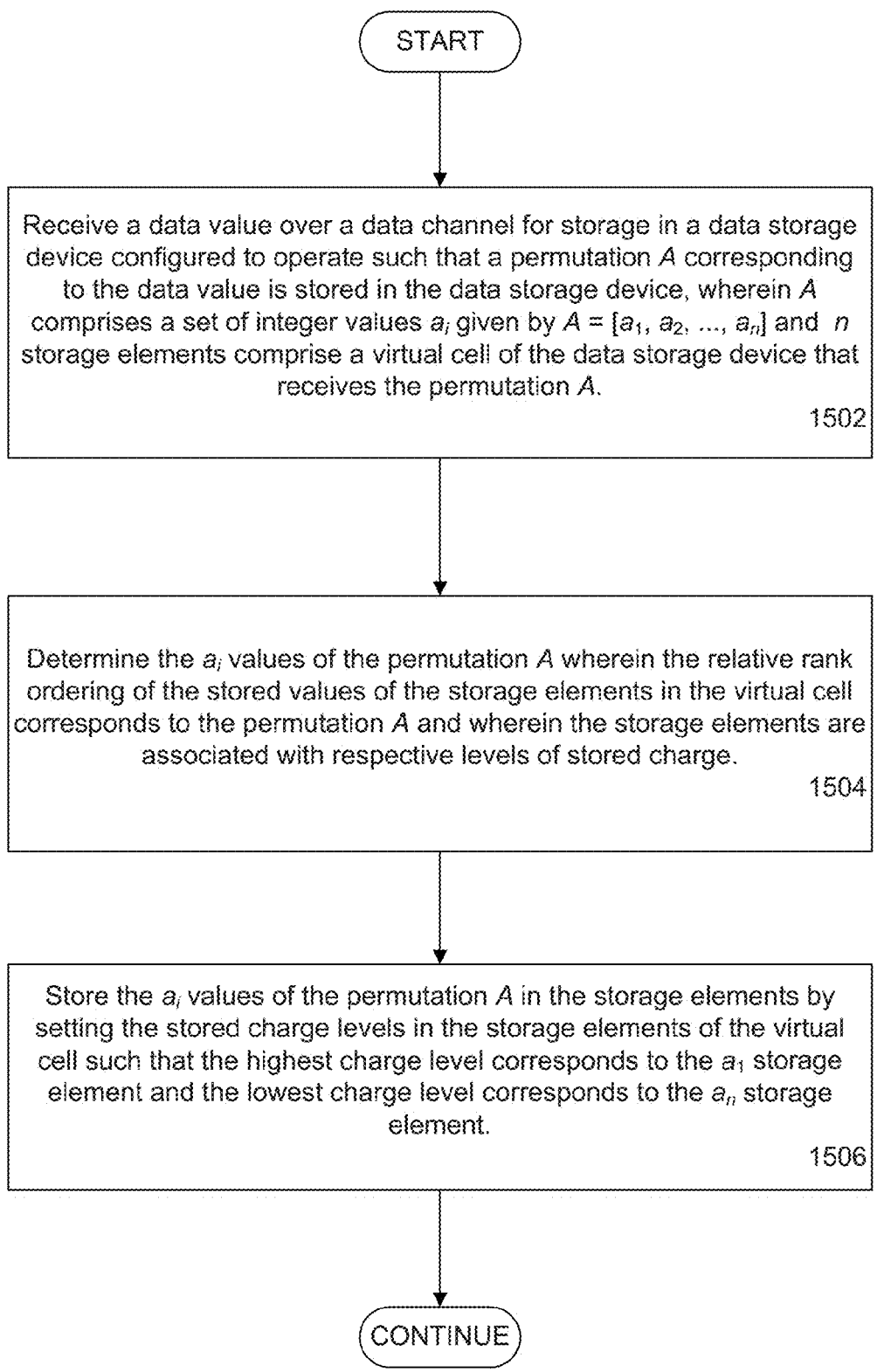
FIG. 16 is a flow diagram that shows programming operations of a data storage device constructed in accordance with the description herein.

FIG. 16 is a flow diagram that shows reading operations of a data storage device that includes storage elements such as memory cells. The reading operations will determine charge levels of the n storage elements in a virtual cell so as to identify a corresponding permutation of integer values $a_i$ given by $A=[a_1, a_2, \ldots, a_n]$. The permutation then determines a corresponding data value. In the first operation, indicated by box 1602, the data storage device receives a binary representation of data comprising $a_i$ values that define a rank modulation codeword given by A, where $A=[a_1, a_2, \ldots, a_n]$ integer values. At the next operation, box 1604, the device determines a data value that corresponds to the rank modulation codeword. At the last operation, box 1606, the device provides the values of the N cells to a data destination over an information channel.

The rank modulation code may be implemented for an information channel comprising a transmitted signal, rather than comprising a data connection to memory cells. In that situation, the operations of FIG. 16 would be performed analogously. For example, the read operation of box 1602 corresponds to receiving a signal and determining signal features, rather than reading memory cell charge levels. The signal features can comprise modulation of the signal frequency, magnitude, or duration over time. The determining operation (box 1604) relates to determining a rank ordering, such as in accordance with signal features. Thus, in the case of using signal frequency, the highest detected signal frequency over a predetermined duration defines the highest cell value, the next highest detected signal frequency defines the next highest cell value, and so forth, to determine a codeword.

Figure 17:
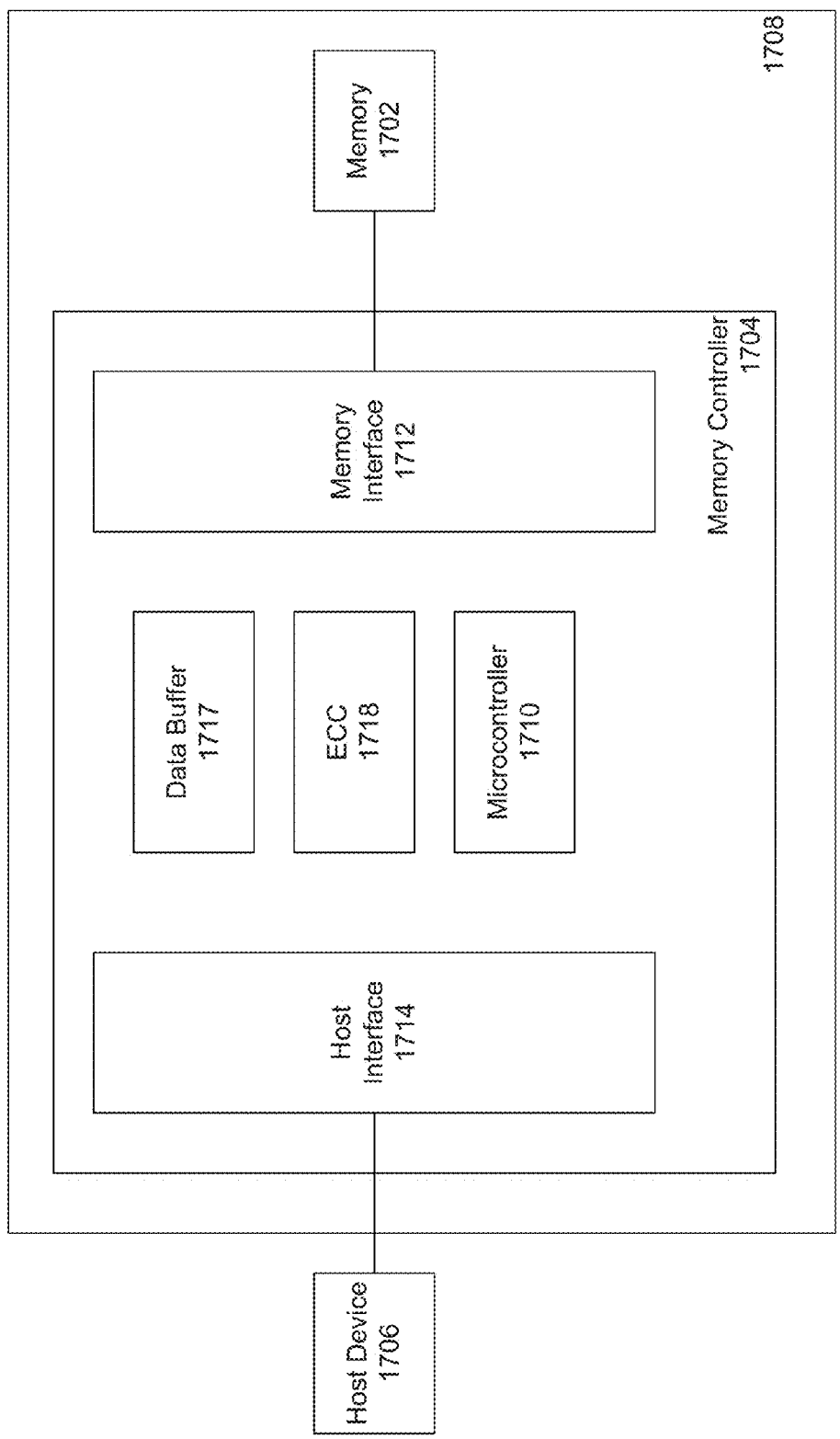
FIG. 17 is an illustration of a memory device constructed in accordance with the present invention.

FIG. 17 is an illustration of a data device constructed in accordance with the present invention. FIG. 17 shows a memory 1702 that is accessed by a memory controller 1704 that communicates with a host device 1706. The memory 1702 is used for storing data that is represented in accordance with a rank modulation coding scheme. The memory may be implemented, for example, as a Flash memory having multilevel cells. The memory 1702 and memory controller 1704 together comprise a data storage device 1708 that may be external to the host device or may be integrated with the host device into a single component or system. For example, the data storage device 1708 may comprise a Flash memory device (often referred to as a "thumb drive") that communicates with a host computer 1706 via a USB connection, or the data storage device may comprise a solid state drive (SSD) that stores data for a host computer system. Alternatively, the data storage device may be integrated with a suitable host device to comprise a single system or component with rank modulation memory, such as a smart phone, network router, MP3 player, or the like.

The memory controller 1704 operates under control of a microcontroller 1710, which manages communications with the memory 1702 via a memory interface 1712 and manages communications with the host device via a host interface 1714. Thus, the memory controller supervises data transfers from the host 1706 to the memory 1702 and from the memory 1702 to the host 1706. The memory controller 1704 also includes a data buffer 1716 in which data values may be temporarily stored for transmission over the data channel controller 1716 between the memory 1702 and the host 1706. The memory controller also includes an ECC block 1718 in which data for the ECC is maintained. For example, the ECC block 1718 may comprise data and program code to perform error correction operations for rank modulation code. Such error correction operations are described, for example, in the U.S. patent application entitled "Error Correcting Codes for Rank Modulation" by Anxiao Jiang et al. filed Nov. 20, 2008. The ECC block 1718 may contain parameters for the error correction code to be used for the memory 1702, such as programmed operations for translating between received symbols and error-corrected symbols, or the ECC block may contain lookup tables for codewords or other data, or the like. The memory controller 1704 performs the operations described above for decoding data and for encoding data.

The operations described above for operating a data storage device, for reading data from a device, for programming a data storage device, and encoding and decoding, can be carried out by the operations depicted in FIGS. 13, 14, and 15, which can be performed by the microcontroller 1710 and associated components of the data storage device 1708. For example, in an implementation of the rank modulation coding scheme in a USB thumb drive, all the components of the data storage device 1708 depicted in FIG. 17 are contained within the USB thumb drive.

Figure 18:
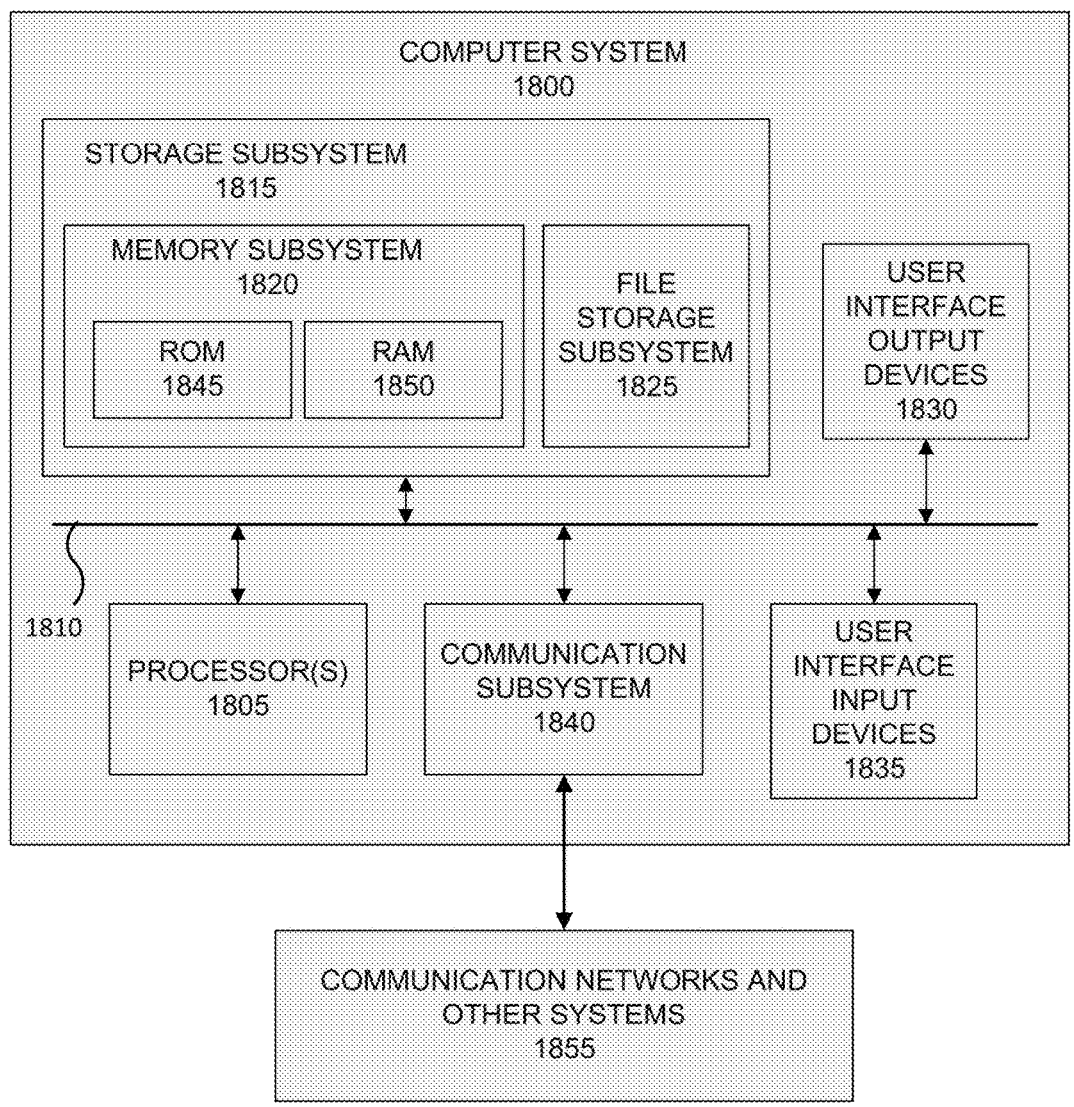
FIG. 18 is a block diagram of a computer apparatus for performing the programming and reading operations described herein and for communicating with a memory device such as depicted in FIG. 17.

The processing components such as the controller 1704 and microcontroller 1710 may be implemented in the form of control logic in software or hardware or a combination of both, and may comprise processors that execute software program instructions from program memory, or as firmware, or the like. The host device 1706 may comprise a conventional computer apparatus. A conventional computer apparatus also may carry out the operations described herein and depicted in FIGS. 15 and 16. FIG. 18 is a block diagram of a computer apparatus 1800 sufficient to perform as a host device and sufficient to perform the operations described herein and depicted in FIGS. 15 and 16.

FIG. 18 is a block diagram of a computer system 1800 that may incorporate embodiments of the present invention and perform the operations described herein. The computer system 1800 typically includes one or more processors 1805, a system bus 1810, storage subsystem 1815 that includes a memory subsystem 1820 and a file storage subsystem 1825, user interface output devices 1830, user interface input devices 1835, a communications subsystem 1840, and the like.

In various embodiments, the computer system 1800 typically includes conventional computer components such as the one or more processors 1805. The file storage subsystem 1825 can include a variety of memory storage devices, such as a read only memory (ROM) 1845 and random access memory (RAM) 1850 in the memory subsystem 1820, and direct access storage devices such as disk drives. As noted, the direct access storage device may comprise a rank modulation data storage device that operates as described herein.

The user interface output devices 1830 can comprise a variety of devices including flat panel displays, touchscreens, indicator lights, audio devices, force feedback devices, and the like. The user interface input devices 1835 can comprise a variety of devices including a computer mouse, trackball, trackpad, joystick, wireless remote, drawing tablet, voice command system, eye tracking system, and the like. The user interface input devices 1835 typically allow a user to select objects, icons, text and the like that appear on the user interface output devices 1830 via a command such as a click of a button or the like.

Embodiments of the communication subsystem 1840 typically include an Ethernet card, a modem (telephone, satellite, cable, ISDN), (asynchronous) digital subscriber line (DSL) unit, FireWire (IEEE 1394) interface, USB interface, and the like. For example, the communications subsystem 1840 may be coupled to communications networks and other external systems 1855 (e.g., a network such as a LAN or the Internet), to a FireWire bus, or the like. In other embodiments, the communications subsystem 1840 may be physically integrated on the motherboard of the computer system 1800, may be a software program, such as soft DSL, or the like.

The RAM 1850 and the file storage subsystem 1825 are examples of tangible media configured to store data such as error correction code parameters, codewords, and program instructions to perform the operations described herein when executed by the one or more processors, including executable computer code, human readable code, or the like. Other types of tangible media include program product media such as floppy disks, removable hard disks, optical storage media such as CDs, DVDs, and bar code media, semiconductor memories such as flash memories, read-only-memories (ROMs), battery-backed volatile memories, networked storage devices, and the like. The file storage subsystem 1825 includes reader subsystems that can transfer data from the program product media to the storage subsystem 1815 for operation and execution by the processors 1805.

The computer system 1800 may also include software that enables communications over a network (e.g., the communications network 1855) such as the DNS, TCP/IP, UDP/IP, and HTTP/HTTPS protocols, and the like. In alternative embodiments, other communications software and transfer protocols may also be used, for example IPX, or the like.

It will be readily apparent to one of ordinary skill in the art that many other hardware and software configurations are suitable for use with the present invention. For example, the computer system 1800 may be a desktop, portable, rack-mounted, or tablet configuration. Additionally, the computer system 1800 may be a series of networked computers. Further, a variety of microprocessors are contemplated and are suitable for the one or more processors 1805, such as PENTIUM™ microprocessors from Intel Corporation of Santa Clara, Calif., USA; OPTERON™ or ATHLON XP™ microprocessors from Advanced Micro Devices, Inc. of Sunnyvale, Calif., USA; and the like. Further, a variety of operating systems are contemplated and are suitable, such as WINDOWS®, WINDOWS XP®, WINDOWS VISTA®, or the like from Microsoft Corporation of Redmond, Wash., USA, SOLARIS® from Sun Microsystems, Inc. of Santa Clara, Calif., USA, various Linux and UNIX distributions, and the like. In still other embodiments, the techniques described above may be implemented upon a chip or an auxiliary processing board (e.g., a programmable logic device or graphics processor unit).

The present invention can be implemented in the form of control logic in software or hardware or a combination of both. The control logic may be stored in an information storage medium as a plurality of instructions adapted to direct an information-processing device to perform a set of steps disclosed in embodiments of the present invention. Based on the disclosure and teachings provided herein, a person of ordinary skill in the art will appreciate other ways and/or methods to implement the present invention.

The rank modulation scheme described herein can be implemented in a variety of systems for encoding and decoding data for transmission and storage. That is, codewords are received from a source over an information channel according to a rank modulation scheme and are decoded into their corresponding data values and provided to a destination, such as a memory or a processor, and data values for storage or transmission are received from a source over an information channel and are encoded into a rank modulation scheme.

Figure 19:
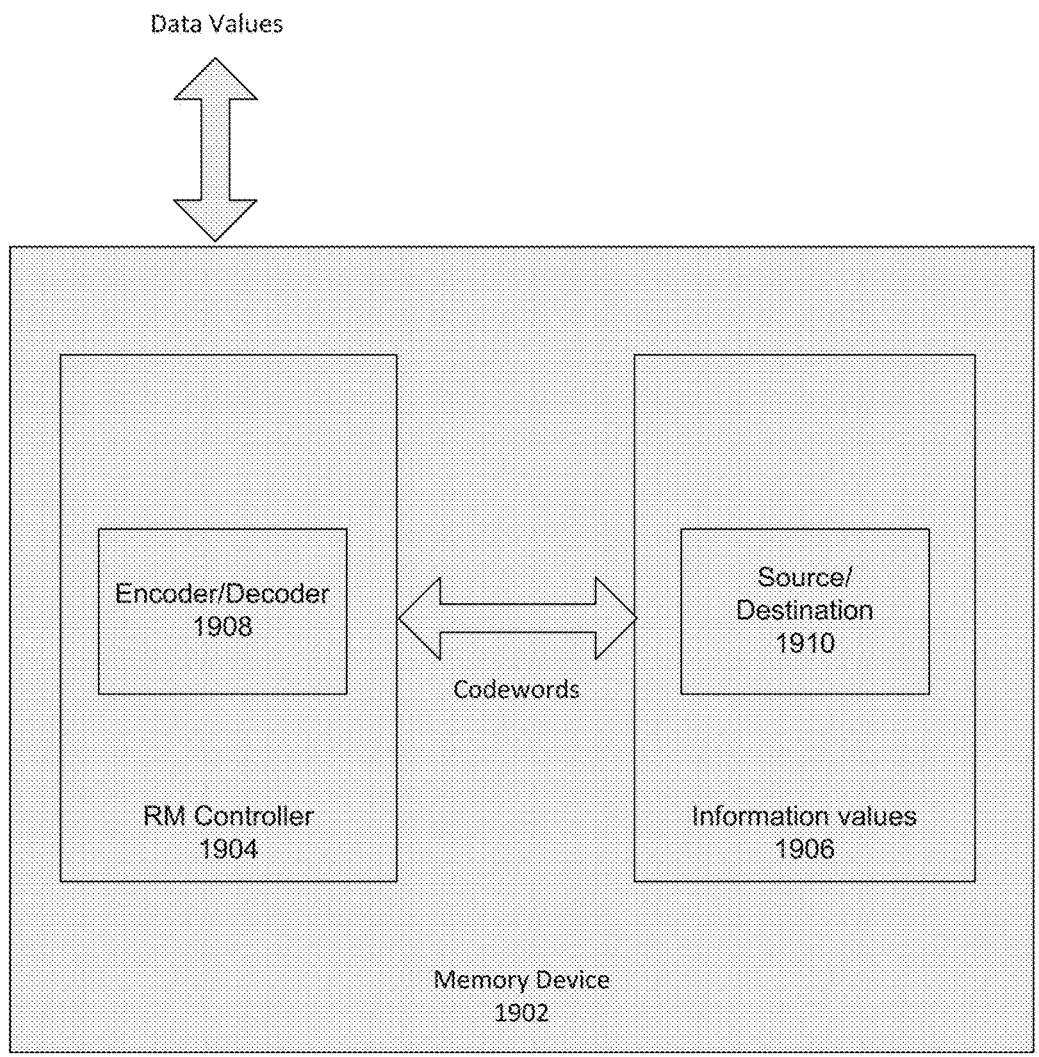
FIG. 19 is a block diagram that shows data flow in a memory device that operates according to the rank modulation scheme described herein.

The operations of encoding and decoding data according to the rank modulation scheme can be illustrated as in FIG. 19, which shows data flow in a data device 1902 that operates according to the rank modulation scheme described herein. In FIG. 19, the device includes a Rank Modulation (RM) controller 1904 that stores and retrieves information values 1906. The RM controller 1904 includes an encoder and decoder 1908 for encoding data values into codewords and decoding codewords into data values. The RM controller encodes data values and provides codewords to the source/destination block 1910, and decodes codewords from the source/destination and provides corresponding data values. The two-way nature of the data flow is indicated by the double-ended arrows labeled "data values" and "codewords". The RM controller includes interfaces through which the RM controller receives and provides the data values and the information values (codewords). The details of such interfaces will be known to those skilled in the art.

The information values 1906 comprise the means for physically representing data comprising the data values and codewords. For example, the information values 1906 may represent charge levels of memory cells, such that multiple cells are configured to operate as a virtual cell in which charge levels of the cells determine a permutation of the rank modulation code. Data values are received and encoded to permutations of a rank modulation code and charge levels of cells are adjusted accordingly, and rank modulation codewords are determined according to cell charge levels, from which a corresponding data value is determined. Alternatively, the information values 1906 may represent features of a transmitted signal, such as signal frequency, magnitude, or duration, such that the cells or bins are defined by the signal features and determine a permutation of the rank modulation code. For example, rank ordering of detected cell frequency changes over time can determine a permutation, wherein the highest signal frequency denotes the highest cell level. Other schemes for physical representation of the cells will occur to those skilled in the art, in view of the description herein.

For information values 1906 in the case of cell charge levels, the source/destination 1910 comprises memory cells in which n memory cells provide n cell values whose charge levels define a rank modulation permutation. For storing a codeword, the memory cells receive an encoded codeword and comprise a destination, and for reading a codeword, the memory cells provide a codeword for decoding and comprise a source. In the case of data transmission, the source/destination 1910 may comprise a transmitter/receiver that processes a signal with signal features such as frequency, magnitude, or duration that define cells or bins such that the signal features determine a permutation. That is, signal components comprising signal frequency, magnitude, or duration may be controlled and modulated by the transmitter such that a highest signal frequency component or greatest magnitude component or greatest time component corresponds to a highest cell level, followed by signal component values that correspond to other cell values and thereby define a permutation of the rank modulation code. When the source/destination 1910 receives a codeword from the controller 1904, the source/destination comprises a transmitter of the device 1902 for sending an encoded signal. When the source/destination provides a codeword to the controller 1904 from a received signal, the source/destination comprises a receiver of the device for receiving an encoded signal. Those skilled in the art will understand how to suitably modulate signal components of the transmitted signal to define rank modulation code permutations, in view of the description herein.

VI. Conclusion

In summary, a simple method to make RM implementable using existing flash memories has been described and disclosed. The implementation of RM has been evaluated under different types of noise in flash, and evaluation results show that RM provides excellent reliability compared to conventional MLC. Moreover, it has been demonstrated that the use of RM in flash-based archival storage significantly extends the data retention time. The disclosure herein not only brings RM into practice, but also can shed new light on designing more reliable flash memory in the future.

What is claimed is:

1. A data device comprising:
   a host interface that is configured to receive a binary representation of a data value to be encoded into a rank modulation codeword;
   a controller that is configured to:
   receive the binary representation from the host interface, wherein the rank modulation codeword represents a state P of N cells, such that each of the N cells stores a charge and has a state represented by up to r charge levels;

map each binary representation of the data value to a state P of one of the N cells in sequence of bits of the data value;

provide values of the N cells to a data destination over an information channel;

receive a binary representation of data comprising $a_i$ values that define a rank modulation codeword given by A, where $A=[a_1, a_2, \ldots, a_N]$ integer values;

detect a cell error in an $a_j$ value of the rank modulation codeword such that two or more cells having different ranks are initially mapped to a same $a_i$ integer value; and assign each of the two or more cells to different $a_i$ integer values, the assigning comprising an adaptive rank reading process in which a rank to be assigned to each of the two or more cells is determined in a rank voting process.

2. A data device as in claim 1, wherein the data destination comprises a transmitter that transmits a signal containing the codeword and the information channel comprises a communication channel over which the transmitter transmits the signal.

3. A data device as in claim 1, wherein the data destination comprises a memory in a data device and the information channel comprises a data connection of the data device.

4. A data device as in claim 1, wherein assigning each of the two or more cells to different $a_i$ integer values comprises randomly assigning each of the two or more cells to different $a_i$ integer values in a random tie breaking process.

5. A data device as in claim 1, wherein N cell values comprise charge levels of N memory cells of the data device and the $a_i$ values correspond to the charge levels.

6. A data device as in claim 1, wherein the controller is further configured to map each binary representation of the data value to a state P of one of the N cells in a sequence comprising Least Significant Bit to Most Significant Bit.

7. A data device as in claim 1, wherein the rank modulation codeword is comprised of a plurality of ranks, and the controller is configured to map each binary representation of the data value to one of the N cells, wherein a number of N cells in at least one rank is different from a number of N cells in a second rank.

8. A data device as in claim 7, wherein the controller is further configured to provide metadata to the data destination along with the values of the N cells.

9. A data device as in claim 8, wherein the metadata relates to a corresponding rank, and the metadata indicates a number of cells in the corresponding rank.

10. A computer method of operating a data device, the computer method comprising:

receiving a binary representation from a host interface, the binary representation comprising a data value to be encoded into a rank modulation codeword, wherein the rank modulation codeword represents a state P of N cells, such that each of the N cells stores a charge and has a state represented by one of r charge levels;

mapping each binary representation of the data value to a state P of one of the N cells in sequence of bits of the data value;

providing values of the N cells to a data destination over an information channel;

receiving a binary representation of data comprising $a_i$ values that define a rank modulation codeword given by A, where $A=[a_1, a_2, \ldots, a_N]$ integer values;

detecting a cell error in an $a_j$ value of the rank modulation codeword such that two or more cells having different ranks are initially mapped to a same $a_i$ integer value; and assigning each of the two or more cells to different $a_i$ integer values, the assignment comprising an adaptive rank reading process in which a rank to be assigned to each of the two or more cells is determined in a rank voting process.

11. A computer method as in claim 10, wherein the data destination comprises a transmitter that transmits a signal containing the codeword and the information channel comprises a communication channel over which the transmitter transmits the signal.

12. A computer method as in claim 10, wherein the data destination comprises a memory in a data device and the information channel comprises a data connection of the data device.

13. A computer method as in claim 10, wherein assigning each of the two or more cells to different $a_i$ integer values comprises randomly assigning each of the two or more cells to different $a_i$ integer values in a random tie breaking process.

14. A computer method as in claim 10, wherein N cell values comprise charge levels of N memory cells of the data device and the $a_i$ values correspond to the charge levels.

15. A computer method as in claim 10, the method further comprising:

mapping each binary representation of the data value to a state P of one of the N cells in a sequence comprising Least Significant Bit to Most Significant Bit.

16. A computer method as in claim 10, wherein the rank modulation codeword is comprised of a plurality of ranks, the method further comprising:

mapping each binary representation of the data value to one of the N cells, wherein a number of N cells in at least one rank is different from a number of N cells in a second rank.

17. A computer method as in claim 16, the method further comprising:

providing metadata to the data destination along with the values of the N cells.

18. A computer method as in claim 17, wherein the metadata relates to a corresponding rank, and the metadata indicates a number of cells in the corresponding rank.

19. A computer method of operating a data device, the method comprising:

receiving a binary representation of data comprising $a_i$ values that define a rank modulation codeword given by A, where $A=[a_1, a_2, \ldots, a_N]$ integer values;

detecting a cell error in an $a_j$ value of the rank modulation codeword such that two or more cells of N cells having different ranks are initially mapped to a same $a_i$ integer value;

assigning each of the two or more cells to different $a_i$ integer values, the assignment comprising an adaptive rank reading process in which a rank to be assigned to each of the two or more cells is determined in a rank voting process determining a data value that corresponds to the rank modulation codeword;

providing the values of the N cells to a data destination over an information channel.

20. A computer method as in claim 19, wherein assigning each of the two or more cells to different $a_i$ integer values comprises randomly assigning each of the two or more cells to different $a_i$ integer values in a random tie breaking process.

21. A computer method as in claim 19, wherein N cell values comprise charge levels of N memory cells of the data device and the $a_i$ values correspond to the charge levels.

22. A computer method as in claim 19, the method further comprising:
    mapping each binary representation of the data value to a state P of one of the N cells in a sequence comprising Least Significant Bit to Most Significant Bit.

23. A computer method as in claim 19, wherein the rank modulation codeword is comprised of a plurality of ranks, the method further comprising:
    mapping each binary representation of the data value to one of the N cells, wherein a number of N cells in at least one rank is different from a number of N cells in a second rank.

24. A computer method as in claim 23, further comprising:
    providing metadata to the data destination along with the values of the N cells.

25. A computer method as in claim 24, wherein the metadata relates to a corresponding rank, and the metadata indicates a number of cells in the corresponding rank.

* * * * *